US010578665B2

(12) United States Patent
Regau

(10) Patent No.: US 10,578,665 B2
(45) Date of Patent: Mar. 3, 2020

(54) METHOD FOR IDENTIFYING A SHORT CIRCUIT IN A FIRST LIGHT EMITTING DIODE ELEMENT, AND OPTOELECTRONIC SUBASSEMBLY

(71) Applicant: OSRAM OLED GmbH, Regensburg (DE)

(72) Inventor: Kilian Regau, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 400 days.

(21) Appl. No.: 15/504,039

(22) PCT Filed: Jul. 16, 2015

(86) PCT No.: PCT/EP2015/066313
§ 371 (c)(1),
(2) Date: Feb. 15, 2017

(87) PCT Pub. No.: WO2016/030081
PCT Pub. Date: Mar. 3, 2016

(65) Prior Publication Data
US 2017/0269146 A1    Sep. 21, 2017

(30) Foreign Application Priority Data

Aug. 26, 2014  (DE) .................. 10 2014 112 171

(51) Int. Cl.
*G01R 31/26* (2020.01)
*G01R 31/02* (2006.01)
*H05B 33/08* (2020.01)

(52) U.S. Cl.
CPC ....... *G01R 31/2635* (2013.01); *G01R 31/025* (2013.01); *H05B 33/089* (2013.01);
(Continued)

(58) Field of Classification Search
CPC ........ G01R 31/00; G01R 31/02; G01R 31/26; G01R 31/2632; G01R 31/2635;
(Continued)

(56) References Cited

U.S. PATENT DOCUMENTS 7,391,335 B2    6/2008  Mubaslat et al.
9,329,243 B2    5/2016  Lin
(Continued)

FOREIGN PATENT DOCUMENTS

CN    201666932 U    12/2010
CN    102540002 A    7/2012
(Continued)

OTHER PUBLICATIONS

Korean Office Action based on application No. 10-2017-7004241 (7 pages and 7 pages of English translation) dated May 1, 2018 (Reference Purpose Only).
(Continued)

*Primary Examiner* — Son T Le
(74) *Attorney, Agent, or Firm* — Viering, Jentschura & Partner MBB

(57) ABSTRACT

A method for identifying a short in a first light emitting diode element may include providing a first actuating circuit being a switched-off condition, wherein an output thereof is coupled to a first electrode of the first light emitting diode element, providing a second actuating circuit being a switched-off condition, wherein an output thereof is coupled to a first electrode of a second light emitting diode element and wherein inputs of the first and second actuating circuits, second electrodes of the first and second light emitting diode elements are electrically coupled to a first node, coupling the first electrode of the first light emitting diode element to a first connection of a test energy source, operating the first light emitting diode element in the off-state region using the
(Continued)

test energy source, performing a check whether an electric current flows via the first light emitting diode element, and identifying the short.

9 Claims, 8 Drawing Sheets

(52) U.S. Cl.
CPC ..... *H05B 33/0827* (2013.01); *H05B 33/0893* (2013.01); *H05B 33/0896* (2013.01)

(58) Field of Classification Search
CPC .. H05B 33/08; H05B 33/0803; H05B 33/089; H05B 33/0827; H05B 33/0896; H05B 33/0893
See application file for complete search history.

(56) References Cited

U.S. PATENT DOCUMENTS

| | | | |
|---|---|---|---|
| 2004/0164939 | A1 | 8/2004 | Johnson et al. |
| 2004/0201496 | A1 | 10/2004 | Hering et al. |
| 2006/0015272 | A1 | 1/2006 | Giraldo et al. |
| 2009/0009088 | A1 | 1/2009 | Ito et al. |
| 2009/0262545 | A1* | 10/2009 | Amelung ............... B60Q 1/34 362/487 |
| 2013/0265056 | A1 | 10/2013 | Lin |
| 2013/0278273 | A1 | 10/2013 | Barlag et al. |

FOREIGN PATENT DOCUMENTS

| | | | |
|---|---|---|---|
| CN | 103076532 | A | 5/2013 |
| CN | 103260934 | A | 8/2013 |
| CN | 103369804 | A | 10/2013 |
| DE | 102012201317 | A1 | 8/2013 |
| EP | 1538588 | A2 | 6/2005 |
| EP | 2549835 | A2 | 1/2013 |
| JP | 2003051384 | A | 2/2003 |
| JP | 4775912 | B2 | 9/2011 |
| JP | 2013182988 | A | 9/2013 |
| KR | 100662994 | B1 | 12/2006 |
| KR | 1020140094048 | A | 7/2014 |
| WO | 03017728 | A1 | 2/2003 |
| WO | 2007022409 | A2 | 2/2007 |
| WO | 2008050380 | A1 | 5/2008 |
| WO | 2013114295 | A1 | 8/2013 |

OTHER PUBLICATIONS

Chinese Office Action including search report issued for corresponding Chinese patent application 201580040595.6, dated Sep. 4, 2018, 6 pages and 8 pages translation (for informational purpose only).
Zheng Minjuan, "Design and Manufacture of LED Electrical Parameter Comprehensive Tester", dated Aug. 31, 2011, pp. 51-57, vol. 3, published in Journal of Xiamen Radio and Television University.
German Search Report based on application No. 10 2014 112 171.6 (7 pages) dated Apr. 30, 2015 (for reference purpose only).
International Search Report based on application No. PCT/EP2015/066313 (7 pages) dated Nov. 3, 2015 for (reference purpose only).
German Office Action based on application No. 10 2014 112 171.6 (6 pages) dated May 26, 2017 (Reference Purpose Only).

* cited by examiner

METHOD FOR IDENTIFYING A SHORT CIRCUIT IN A FIRST LIGHT EMITTING DIODE ELEMENT, AND OPTOELECTRONIC SUBASSEMBLY

RELATED APPLICATIONS

The present application is a national stage entry according to 35 U.S.C. § 371 of PCT application No.: PCT/EP2015/066313 filed on Jul. 16, 2015, which claims priority from German application No.: 10 2014 112 171.6 filed on Aug. 26, 2014, and is incorporated herein by reference in its entirety.

TECHNICAL FIELD

Various embodiments relate to a method for identifying a short in a first light emitting diode element and to an optoelectronic subassembly.

BACKGROUND

Optoelectronic components that emit light may be, by way of example, light emitting diodes (LEDs) or organic light emitting diodes (OLEDs). An OLED can have an anode and a cathode with an organic functional layer system in between. The organic functional layer system can have one or more emitter layers in which electromagnetic radiation is generated, a charge carrier pair generating layer structure including two or more respective charge carrier pair generating layers ("charge generating layer", CGL) for charge carrier pair generation, and one or more electron blocking layers, also referred to as hole transport layer(s) (HTL), and one or more hole blocking layers, also referred to as electron transport layer(s) (ETL), in order to direct the flow of current.

Optoelectronic subassemblies have, by way of example, two or more optoelectronic components, for example LEDs and/or OLEDs, and actuating circuits, for example drivers, for operating the optoelectronic components. The optoelectronic components may, by way of example, be electrically connected in electrical parallel. An optoelectronic component, for example an OLED, may be segmented and therefore have multiple OLED elements. The OLED elements may, by way of example, be electrically connected in parallel and/or share at least one common electrode. By way of example, two OLED elements have the same cathode, but have mutually isolated organic functional layer structures and accordingly mutually isolated anodes. This can contribute to a short in one of the OLED elements allowing the other OLED elements to continue to be operated in principle.

Despite complex quality controls for OLEDs, OLEDs in application cannot be prevented completely from failing spontaneously. A typical fault pattern for spontaneous failures are shorts between the electrodes. Such shorts are normally very small in terms of area, and therefore a large part of the total current is concentrated at this short point. The current density is consequently distinctly inflated, which means that these points can heat up to a very great degree depending on formation. This can lead to the electrodes melting, to dark spots in the illuminated image, to completely dark OLEDs and/or simply to points on the OLED that become very hot. In order to prevent potential hazards as a result of this overheating (combustion risk, fire, rupture), such a short should be identified by the actuating or driver electronics or a superordinate evaluation unit and/or computation unit and an appropriate reaction, for example a protective measure, should occur (disconnection of the shorted component, generation of warning signals, bypassing, that is to say circumvention of the short, etc.). Specifically in the automobile sector, it is a requirement for manufacturers that e.g. defective OLEDs or LEDs in rear lamps have to be identified electronically and reported at least to the onboard system.

It is known practice to identify shorts in OLEDs by virtue of an overvoltage or undervoltage across the OLEDs being recorded and being used as a criterion for a defect. As a reaction to the identification of the short, it is possible for bypassing and/or fault signal generation to occur.

SUMMARY

Various embodiments provide a method for identifying a short in a first light emitting diode element that is simple and/or inexpensive to perform and/or that contributes to safe operation of the first light emitting diode element and/or of an optoelectronic subassembly that has the first light emitting diode element.

Various embodiments further provide an optoelectronic subassembly that is of simple and/or inexpensive design and/or can be operated safely.

Various embodiments are achieved by a method for identifying a short in a first light emitting diode element as claimed in claim(s) 1 and/or 3.

Various embodiments are achieved by an optoelectronic subassembly as claimed in claim(s) 7 and/or 9.

A method for identifying a short in a first light emitting diode element. The method involves the first light emitting diode element being operated in the off-state region. A check is performed to determine whether an electric current flows via the first light emitting diode element in the off-state direction. The short is identified if the check reveals that the current flows in the off-state direction and is larger than a prescribed leakage current.

The method is based on an intact light emitting diode element, for example an LED, an OLED or an OLED element, exhibiting a rectifier effect, i.e. conducting current in the forward direction (nonlinear characteristic curve) and blocking the current in the reverse direction, except the leakage current, which in principle occurs in any diode, is usually well known and is frequently negligible. A defective LED or OLED that has a short no longer has a rectifying effect. The short bypasses the semiconductor layers, and the LED or OLED exhibits approximately the same conductivity in both polarization directions (forward and reverse operation). Thus, a reverse voltage, particularly a moderate reverse voltage, is applied to the LED or OLED or a moderate reverse current is impressed in order to identify an abnormal reverse behavior. If the reverse voltage and the reverse current are moderate, then this means, by way of example, that the relevant LED or OLED is operated in the off-state region and not in the breakdown region, for example in a region that is approximately equivalent, in terms of absolute value, to the forward voltage at the rated operating point of the LED or OLED. The moderate reverse voltage may, by way of example, be less than or equal, in terms of absolute value, to the rated voltage during forward operation. The rated voltage is the voltage that is advantageously applied to the OLED during normal forward operation.

Although OLEDs are, in principle, not intended for operation in the off-state region, that is to say reverse operation, the moderate reverse voltages in short pulses and/or for short periods cause no damage to the OLED and do not impair performance. The method can therefore involve the first light emitting diode element being operated in short pulses and/or for short periods in the off-state region. If the first light emitting diode element or the relevant light emitting diode is operated in pulsed fashion during forward operation, then the pulse duration can be chosen to be so short that the pulses lie completely in the pulse pauses of forward operation during reverse operation.

The first light emitting diode element may be, by way of example, an individually operated LED or OLED, a single LED or OLED that is operated together with other LEDs and/or OLEDs, for example by means of electrical coupling of the cathodes or anodes thereof, or a segment of a multisegment OLED having two or more light emitting diode elements that have a common cathode or anode. By way of example, the first light emitting diode element can, alongside other single LEDs, OLEDs or OLED segments, be actuated separately, for example in order to realize dynamic light effects, for example in the automotive sector, for example in order to represent turn indicator scenarios and/or welcome scenarios.

If the first light emitting diode element is operated in the off-state region, then this can mean, by way of example, that a moderate reverse voltage is applied to the LED or OLED or a moderate reverse current is impressed into the LED or OLED. The operation of the first light emitting diode element in the off-state region can be effected in different ways, as explained in more detail below. The identification of the flow of current in the off-state direction can likewise be effected in different ways, in particular it is possible for the flow of current in the off-state direction to be identified directly or indirectly. The flow of current in the off-state direction can be detected directly via different measurements of the flow of current, for example. The flow of current in the off-state direction can also be detected indirectly, however, by means of effects that the flow of current in the off-state direction causes being checked. If the flow of current in the off-state direction is recorded directly or its presence is identified indirectly during checking and if said flow of current is larger than the prescribed leakage current of the first light emitting diode element, then the short is identified and the relevant first light emitting diode element is identified as faulty.

The method can be performed in a dedicated test mode or test sequence that is performed, by way of example, before or after operation of the LED or OLED (for example when the automobile tail light is switched on or off, or the like). Alternatively or additionally, the method can be performed during operation of the first light emitting diode element, for example in light/current pauses during pulsed operation (PWM operation).

The test for the short, that is to say operation of the first light emitting diode element in the off-state region, can be performed by a separate test voltage or current source, for example can be implemented by means of an inverting DC/DC converter or a charge pump circuit, or by virtue of suitable use and/or interconnection of the electronics, for example the actuating circuits or drivers, of an optoelectronic subassembly that has the first light emitting diode element. The whole test system can be designed to have only a few additional components, such as protective diodes, electronic switches (e.g. transistors) and/or measurement transducers, for example, in comparison with "normal" actuating or driver electronics. Alternatively or additionally, functional areas of the already existing actuating or driver electronics can be used for short identification, for example a measuring device for current and/or voltage measurement and/or an output capacitor of a corresponding actuating circuit.

Measured value recording, flow control and/or evaluation of the test and reaction to the result of the test can be performed, by way of example, by a computation unit, for example a microcontroller, for example by the central controller of the driver control. Alternatively or additionally, these functions can also be performed by means of standalone electronics that have, by way of example, analog, digital or "mixed signal" circuits. The reaction to an identification of the short may include deactivation of the relevant light emitting diode actuating circuit, for example the relevant driver, a report to another control group, a central computer and/or microcontroller, actuation of a bypass unit, for example one or more thyristors, MOSFETs, transistors or the like connected in parallel with the relevant light emitting diode element, optionally by means of a latching element. By way of example, feedback to a higher-ranked system is possible, for example to an onboard computer in the automobile, for example in the case of a turn indicator or a reversing light.

The method can, by way of example, be used in the automotive sector or in the consumer sector, for example in the case of a portable lamp with a single light emitting diode element or in the case of a light emitting diode module with an integrated driver for area lighting. The relevant light emitting diodes can then be operated safely, a risk of fire, injury and/or destruction, for example, being able to be particularly low. Alternatively or additionally, the relevant detection circuits can be embodied simply and/or inexpensively, particularly when only low additional complexity for the hardware is pursued and hence no or only slightly higher material costs arise.

According to one development, a check is performed to determine whether the current flows via the first light emitting diode element in the off-state direction by virtue of a reverse voltage being applied to the first light emitting diode element and the current in the off-state direction being recorded, for example being recorded directly. The reverse voltage can, by way of example, be applied by means of a voltage or current source provided specifically for the purpose or by means of an actuating circuit for actuating the first light emitting diode element or another light emitting diode element.

According to one development, a first actuating circuit is arranged that is designed for actuating the first light emitting diode element. The first actuating circuit is in a switched-off condition. By way of example, the first actuating circuit is in an operating state in which the first light emitting diode element is not active, that is to say does not emit light. An output of the first actuating circuit is electrically coupled to a first electrode of the first light emitting diode element. Furthermore, a second actuating circuit is arranged that is designed for actuating a second light emitting diode element. The second actuating circuit is initially likewise in a switched-off condition. By way of example, the second actuating circuit is in an operating state in which the second light emitting diode element is not active, that is to say does not emit light. An output of the second actuating circuit is electrically coupled to a first electrode of the second light emitting diode element. An input of the first actuating circuit, an input of the second actuating circuit, a second electrode of the first light emitting diode element and a second electrode of the second light emitting diode element are electrically coupled to a first node. The first electrode of the first light emitting diode element is electrically coupled to a first connection of a test energy source. A second connection of the test energy source is electrically coupled to the first node. The first light emitting diode element is operated in the off-state region using the test energy source.

According to one development, the test energy source is a test current source. A check is performed to determine whether the electric current flows via the first light emitting diode element in the off-state direction by virtue of a test voltage being recorded that is present across the test current source. Alternatively or additionally, the test energy source is a test voltage source and a check is performed to determine whether the electric current flows via the first light emitting diode element in the off-state direction by virtue of a test current being recorded that flows via the test current source.

According to one development, the first actuating circuit is arranged for actuating the first light emitting diode element and the second actuating circuit is arranged for actuating the second light emitting diode element. The first light emitting diode element is operated in the off-state region by means of the second actuating circuit. This allows an additional energy source and/or driver electronics for identifying the short to be dispensed with. This can contribute to the short being able to be identified particularly simply and/or inexpensively.

According to one development, the first actuating circuit is in a switched-off condition. The output of the first actuating circuit is electrically coupled to the first electrode of the first light emitting diode element. The second actuating circuit is initially likewise in a switched-off condition. The output of the second actuating circuit is electrically coupled to the first electrode of the second light emitting diode element. The input of the first actuating circuit, the input of the second actuating circuit, the second electrode of the first light emitting diode element and the second electrode of the second light emitting diode element are electrically coupled to the first node. The input of the first light emitting diode element is electrically coupled to the first node. The second electrode of the first light emitting diode element and the second electrode of the second light emitting diode element are electrically isolated from the first node, wherein the second electrode of the first light emitting diode element and the second electrode of the second light emitting diode element remain electrically coupled to one another, and the second actuating circuit is switched on, as a result of which the first light emitting diode element is operated in the off-state region. A check is performed to determine whether the electric current flows via the first light emitting diode element in the off-state direction by virtue of an actuating voltage of the second actuating circuit being recorded. The short is identified if the actuating voltage does not reach or does not exceed a first actuating voltage threshold value. Alternatively or additionally, an actuating current of the second actuating circuit is recorded and the short is identified if the actuating current is larger than a prescribed actuating current threshold value.

On account of the electrical isolation of the second electrode of the first light emitting diode element and the second electrode of the second light emitting diode element from the first node and the electrical coupling of the first electrode of the first light emitting diode element to the first node, the second actuating circuit, the first light emitting diode element during reverse operation and the second light emitting diode element during forward operation form a closed circuit. The second electrode of the first light emitting diode element and the second electrode of the second light emitting diode element can initially be electrically isolated from the first node, and then the second actuating circuit can be switched on or the second actuating circuit can initially be switched on and then the second electrode of the first light emitting diode element and the second of electrode the second light emitting diode element can be electrically isolated from the first node.

If there is no short for the first light emitting diode element, the second actuating circuit cannot drive current through the closed circuit, as a result of which the actuating voltage is automatically increased and exceeds the first actuating voltage threshold value. The first actuating voltage threshold value may, by way of example, be firmly prescribed for the relevant actuating circuit or ascertained empirically and then prescribed. If the short is present for the first light emitting diode element, the second actuating circuit can drive the current through the closed circuit without difficulty, for which reason the actuating voltage is not increased and the first actuating voltage threshold value is not reached and not exceeded.

If there is no short for the first light emitting diode element, the second actuating circuit cannot drive current through the closed circuit, for which reason the first actuating current threshold value is not exceeded. The first actuating current threshold value may, by way of example, be firmly prescribed for the relevant actuating circuit or ascertained empirically and then prescribed. If the short is present for the first light emitting diode element, the second actuating circuit can drive the current through the closed circuit without difficulty, for which reason the first actuating current threshold value is exceeded.

To record the actuating voltage or the actuating current, an actuating voltage recording apparatus or actuating current recording apparatus provided specifically for the purpose may be provided. Alternatively, the actuating voltage or the actuating current can be ascertained by means of the electronics of the second actuating circuit. By way of example, if the second actuating circuit has a regulator for operating the second light emitting diode element, the corresponding regulatory electronics themselves can deliver measurement signals that are suitable in this context.

According to one development, an analysis voltage between the first electrode of the first light emitting diode element and the second electrode of the first light emitting diode element is recorded. On the basis of the recorded analysis voltage, the short is classified. The analysis voltage is recorded when the input of the first light emitting diode element is electrically coupled to the first node. The recording of the analysis voltage allows the electrical power in the short to be measured. This can contribute to assessing and/or rating the development progress and/or rating the risk potential.

According to one development, the first actuating circuit is in a switched-off condition. The output of the first actuating circuit is electrically coupled to the first electrode of the first light emitting diode element. The second actuating circuit is initially likewise in a switched-off condition. The output of the second actuating circuit is electrically coupled to the first electrode of the second light emitting diode element. The input of the first actuating circuit, the input of the second actuating circuit, the second electrode of the first light emitting diode element and the second electrode of the second light emitting diode element are electrically coupled to the first node. The first actuating circuit is switched on such that an actuating voltage of the first actuating circuit is smaller than a prescribed second actuating voltage threshold value, as a result of which a capacitor is charged that is electrically connected between the first electrode of the first light emitting diode element and the first node. The second electrode of the first light emitting diode element and the second electrode of the second light emitting diode element are electrically isolated from the first node, wherein the second electrode of the first light emitting diode element and the second electrode of the second light emitting diode element remain electrically coupled to one another, a capacitor voltage of the capacitor is recorded, for example monitored, and the second actuating circuit is switched on, as a result of which the first light emitting diode element is operated in the off-state region. It is identified that the current flows in the off-state direction and is larger than a prescribed leakage current if a change occurring in the capacitor voltage becomes larger than a prescribed capacitor voltage threshold value. If there is no short, the capacitor voltage changes only slightly and/or very slowly. The second actuating threshold value is, by way of example, chosen such that it is less than or equal to a value of a threshold voltage of the light emitting diode element 50 to be checked. The capacitor voltage threshold value can, by way of example, be computed or empirically ascertained, for example such that on the occurrence of the leakage current and the charging of the first capacitor 90 that is possible as a result, the short is not yet identified, but the short is identified if the current $I_R$ in the reverse direction is larger than the prescribed leakage current. The second electrode of the first light emitting diode element and the second electrode of the second light emitting diode element can initially be electrically isolated from the first node and then the second actuating circuit can be switched on or the second actuating circuit can initially be switched on and then the second electrode of the first light emitting diode element and the second electrode of the second light emitting diode element can be electrically isolated from the first node.

Various embodiments are further achieved by an optoelectronic subassembly. The optoelectronic subassembly has a first light emitting diode element and an electronic circuit. The electronic circuit is designed to operate the first light emitting diode element in the off-state region, to check whether an electric current flows via the first light emitting diode element in the off-state direction, and to identify a short in the first light emitting diode element if the check reveals that the current flows in the off-state direction and is larger than a prescribed leakage current. The electronic circuit has, by way of example, the first actuating circuit, the second actuating circuit and/or the test energy source.

According to one development, the optoelectronic subassembly has a test voltage source that is designed to apply a reverse voltage to the first light emitting diode element, and a current measuring apparatus that is designed to record, for example to record directly, the current in the off-state direction.

According to one development, the optoelectronic subassembly has the second light emitting diode element, the first actuating circuit, the second actuating circuit, the test energy source and a first test switch. The second electrode of the first light emitting diode element and the second electrode of the second light emitting diode element are electrically coupled to one another. The output of the first actuating circuit is electrically coupled to the first electrode of the first light emitting diode element. The output of the second actuating circuit is electrically coupled to the first electrode of the second light emitting diode element. The input of the first actuating circuit, an input of the second actuating circuit, the second electrode of the first light emitting diode element and the second electrode of the second light emitting diode element are electrically coupled to the first node. The test energy source has the first connection and the second connection. The second connection is electrically coupled to the first node. The first test switch is electrically coupled to the first electrode of the first light emitting diode element and to the first connection of the test energy source. The first test switch, in its first switching state, electrically couples the first electrode of the first light emitting diode element to the first connection of the test energy source and, in its second switching state, electrically isolates the first electrode of the first light emitting diode element and the first connection of the test energy source from one another.

According to one development, the test energy source is a test current source and has a test voltage recording apparatus. The test voltage recording apparatus is designed to record a test voltage that is present across the test current source. Alternatively or additionally, the test energy source is a test voltage source and the optoelectronic subassembly has a test current recording apparatus that is designed to record a test current that flows via the test current source.

According to one development, the optoelectronic subassembly has the second light emitting diode element, the first actuating circuit for actuating the first light emitting diode element and the second actuating circuit for actuating the second light emitting diode element, which are arranged and designed such that the first light emitting diode element can be operated in the off-state region by means of the second actuating circuit.

According to one development, the optoelectronic subassembly has the first isolating switch. The second electrode of the first light emitting diode element and the second electrode of the second light emitting diode element are electrically coupled to one another. The output of the first actuating circuit is electrically coupled to the first electrode of the first light emitting diode element. The output of the second actuating circuit is electrically coupled to the first electrode of the second light emitting diode element. The input of the first actuating circuit, the input of the second actuating circuit, the second electrode of the first light emitting diode element and the second electrode of the second light emitting diode element are electrically coupled to the first node. The first test switch, in its first switching state, electrically couples the first electrode of the first light emitting diode element to the first node and, in its second switching state, electrically isolates the first electrode of the first light emitting diode element and the first node from one another. The first isolating switch, in its first switching state, electrically couples the second electrode of the first light emitting diode element and the second electrode of the second light emitting diode element to the first node and, in its second switching state, electrically isolates the second electrode of the first light emitting diode element and the second electrode of the second light emitting diode element from the first node.

According to one development, the optoelectronic subassembly has an analysis voltage apparatus that is designed to record the analysis voltage between the first electrode of the first light emitting diode element and the second electrode of the first light emitting diode element.

According to one development, the optoelectronic subassembly has the second light emitting diode element, the first actuating circuit, the second actuating circuit, the first capacitor and a capacitor voltage recording apparatus. The second electrode of the first light emitting diode element and the second electrode of the second light emitting diode element are electrically coupled to one another. The output of the first actuating circuit is electrically coupled to the first electrode of the first light emitting diode element. The output of the second actuating circuit is electrically coupled to the first electrode of the second light emitting diode element. The input of the first actuating circuit, the input of the second actuating circuit, the second electrode of the first light emitting diode element and the second electrode of the second light emitting diode element are electrically coupled to the first node. The first capacitor is electrically coupled firstly to the output of the first actuating circuit and secondly to the input of the first actuating circuit. The first isolating switch, in its first switching state, electrically couples the second electrode of the first light emitting diode element and the second electrode of the second light emitting diode element to the first node and, in its second switching state, electrically isolates the second electrode of the first light emitting diode element and the second electrode of the second light emitting diode element from the first node. The capacitor voltage recording apparatus is designed to record the capacitor voltage of the first capacitor.

According to one development, the optoelectronic subassembly has an organic light emitting diode that has the first light emitting diode element and the second light emitting diode element. The second electrode of the first light emitting diode element and the second electrode of the second light emitting diode element are formed by a second electrode of the organic light emitting diode. By way of example, the organic light emitting diode is segmented and the first light emitting diode element is formed by a first segment of the organic light emitting diode and the second light emitting diode element is formed by a second segment of the organic light emitting diode. Further, the organic light emitting diode can have one, two or more further segments or light emitting diode elements.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
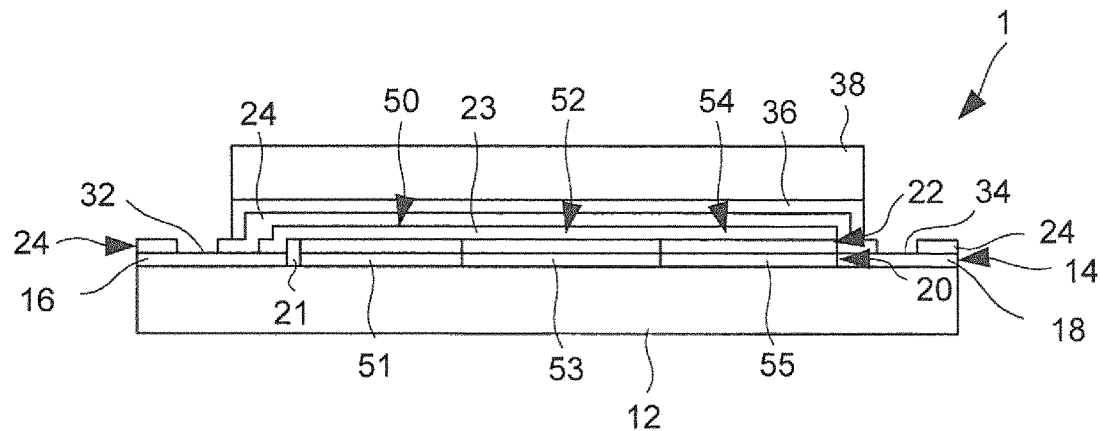
FIG. 1 shows a sectional representation of an exemplary embodiment of a light emitting diode from the side.

In the detailed description that follows, reference is made to the accompanying drawings, which form part of this description and which, for the purposes of illustration, show specific exemplary embodiments in which the present disclosure can be implemented. In this regard, direction terminology such as, for example, "at the top", "at the bottom", "at the front", "at the back", "front", "rear", etc., is used with respect to the orientation of the figure(s) described. Since components of exemplary embodiments can be positioned in a number of different orientations, the direction terminology is used for the purposes of illustration and is not restrictive in any way whatsoever. It goes without saying that other exemplary embodiments can be used and structural or logical changes can be made, without departing from the scope of protection of the present disclosure. It goes without saying that the features of the various exemplary embodiments described herein can be combined with one another, unless specifically indicated otherwise. The detailed description that follows should therefore not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference symbols, insofar as this is expedient.

An optoelectronic subassembly can have one, two or more optoelectronic components. Optionally, an optoelectronic subassembly can also have one, two or more electronic components. An electronic component can have, by way of example, an active and/or a passive component. An active electronic component can have, by way of example, a computation, control and/or regulatory unit and/or a transistor. A passive electronic component can have, by way of example, a capacitor, a resistor, a diode or a coil. An optoelectronic component may be a component emitting electromagnetic radiation. A component emitting electromagnetic radiation may be, by way of example, a semiconductor component emitting electromagnetic radiation and/or may be in the form of a diode emitting electromagnetic radiation, in the form of an organic diode emitting electromagnetic radiation, in the form of a transistor emitting electromagnetic radiation or in the form of an organic transistor emitting electromagnetic radiation. The radiation may be, by way of example, light in the visible range, UV light and/or infrared light. In this context, the component emitting electromagnetic radiation may be, by way of example, in the form of a light emitting diode (LED), in the form of an organic light emitting diode (OLED), in the form of a light emitting transistor or in the form of an organic light emitting transistor. The light emitting component may be, in various exemplary embodiments, part of an integrated circuit. In addition, a plurality of light emitting components may be provided, for example accommodated in a common housing.

FIG. 1 shows a light emitting diode 1, particularly an organic light emitting diode (OLED). Alternatively, the light emitting diode 1 may be not an organic light emitting diode but rather an inorganic light emitting diode, particularly an LED. The light emitting diode 1 has a support 12. The support 12 has an optoelectronic layer structure formed on it.

The optoelectronic layer structure has a first electrically conductive layer 14 that has a first contact section 16, a second contact section 18 and a first electrode layer 20. The support 12 having the first electrically conductive layer 14 can also be referred to as a substrate. The second contact section 18 is electrically coupled to the first electrode layer 20 of the optoelectronic layer structure, for example the second contact section 18 and the first electrode layer are in integral form. The first electrode layer 20 is electrically insulated from the first contact section 16 by means of an electrical insulating barrier 21. Above the first electrode layer 20, an optically functional layer structure, for example an organic functional layer structure 22, of the optoelectronic layer structure is formed. The organic functional layer structure 22 can have, by way of example, one, two or more partial layers formed one above the other, as explained in more detail further below with reference to FIG. 12. Above the organic functional layer structure 22, a second electrically conductive layer, particularly a second electrode layer 23 of the optoelectronic layer structure, is formed that is electrically coupled to the first contact section 16. The first electrode layer 20 serves, by way of example, as an anode or a cathode of the optoelectronic layer structure. The second electrode layer 23 serves, in a manner corresponding to the first electrode layer 20, as a cathode or an anode of the optoelectronic layer structure.

The light emitting diode 1 has at least two, for example three or more, segments, for example a first segment, a second segment and a third segment. In other words, the light emitting diode 1 is segmented. The first segment is formed by a first light emitting diode element 50. The second segment is formed by a second light emitting diode element 52. The third segment is formed by a third light emitting diode element 54. The light emitting diode elements 50, 52, 54 have mutually isolated segments of the organic functional layer structure 22 and mutually isolated segments of the first electrode layer 20. In particular, the first electrode layer 20 has a first electrode 51 of the first light emitting diode element 50, a first electrode 53 of the second light emitting diode element 52 and a first electrode 55 of the third light emitting diode element 54. If the light emitting diode 1 has more or fewer segments, then the first electrode layer 20 has correspondingly more or fewer first electrodes 51, 53, 55. Optionally, the light emitting diode elements 50, 52, 54 share the second electrode layer 23, which is not segmented. Alternatively, in the case of the light emitting diode elements 50, 52, 54, the second electrode layer 23 may be segmented and/or the first electrode layer 20 may not be segmented and/or may be in integral form. The first electrodes 51, 53, 55 may be electrically coupled to various mutually electrically insulated regions of the second contact section 18, which are not represented, so that the light emitting diode elements 50, 52, 54 can be operated independently of one another.

Alternatively, the light emitting diode 1 may be unsegmented, that is to say have no segments, and/or consist of a single light emitting diode element. Further, the light emitting diode 1 may be electrically and/or mechanically coupled to one, two or more further light emitting diodes, not represented. By way of example, the relevant light emitting diodes may be electrically connected in parallel, for example via an electrical connection of the first or second electrodes, for example one of the electrodes of the various light emitting diodes may be in integral form and extend over multiple light emitting diodes.

Above the second electrode layer 23 and partly above the first contact section 16 and partly above the second contact section 18, an encapsulation layer 24 of the optoelectronic layer structure is formed that encapsulates the optoelectronic layer structure. In the encapsulation layer 24, a first recess in the encapsulation layer 24 is formed above the first contact section 16 and a second recess in the encapsulation layer 24 is formed above the second contact section 18. In the first recess in the encapsulation layer 24, a first contact region 32 is exposed, and in the second recess in the encapsulation layer 24, a second contact region 34 is exposed. The first contact region 32 is used for making electrical contact with the first contact section 16, and the second contact region 34 is used for making electrical contact with the second contact section 18.

Above the encapsulation layer 24, an adhesive agent layer 36 is formed. The adhesive agent layer 36 has, by way of example, an adhesive agent, for example an adhesive, for example a laminating adhesive, a lacquer and/or a resin. Above the adhesive agent layer 36, a cover body 38 is formed. The adhesive agent layer 36 is used for mounting the cover body 38 on the encapsulation layer 24. The cover body 38 is used for protecting the light emitting diode 1, for example against mechanical actions of force from the outside. Further, the cover body 38 can be used for distributing and/or dissipating heat that is produced in the light emitting diode 1. The substrate protrudes from the side below the cover body 38. Alternatively, the substrate and the cover body 38 may have their lateral edges formed flush or almost flush, with contact being able to be made with the contact regions 32, 34 via recesses and/or holes in the cover body 38 and/or in the support 12, for example.

Figure 2:
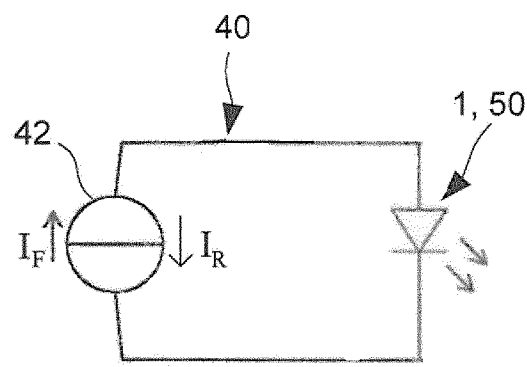
FIG. 2 shows a circuit diagram for an exemplary embodiment of an optoelectronic subassembly.

FIG. 2 shows an optoelectronic subassembly that has a light emitting diode, for example the light emitting diode 1 explained above, and/or a light emitting diode element, for example the first light emitting diode element 50 explained above, and an electronic circuit 40. The electronic circuit 40 has a first actuating circuit 42 for actuating the light emitting diode 1 or the first light emitting diode element 50. The first actuating circuit 42 can also be referred to as a driver for operating the light emitting diode 1 or the first light emitting diode element 50.

In a normal mode, the actuating circuit 42 actuates the light emitting diode 1 or the first light emitting diode element 50 such that it emits light. Optionally, the actuation can take place in the course of closed-loop control. In other words, the light emitting diode 1 and/or the light emitting diode element 50 can be regulated using the actuating circuit 42.

In normal mode, the actuating circuit 42 produces an actuating current $I_F$ and/or an actuating voltage that causes the actuating current $I_F$, wherein the actuating current $I_F$ flows via the light emitting diode 1 or the first light emitting diode element 50 in the forward direction, that is to say in the on-state direction. In normal mode, the light emitting diode 1 or the first light emitting diode element 50 is operated in the on-state region and produces light. The actuating voltage in normal mode can also be referred to as the rated voltage.

In a test mode, a check can be performed to determine whether the light emitting diode 1 and the first light emitting diode element 50 have a short. In test mode, the light emitting diode 1 or the light emitting diode element 50 is operated in the off-state region. The light emitting diode 1 and the light emitting diode element 50 are operated in the off-state region by virtue of a reverse voltage being applied the light emitting diode 1 and the light emitting diode element 50. Provided that the light emitting diode 1 and/or the first light emitting diode element 50 do not have a short, they block a flow of the electric current $I_R$ in the off-state direction except for a leakage current that normally cannot be prevented, which is dependent on the light emitting diode 1 or the first light emitting diode element 50 and may be known, for example prescribed.

If the light emitting diode 1 and/or the first light emitting diode element 50 do have a short, then the light emitting diode 1 or the first light emitting diode element 50 loses its rectifying effect and an electric current $I_R$ flows in the reverse direction, that is to say in the off-state direction, via the light emitting diode 1 or the first light emitting diode element 50, which electric current is larger than the prescribed leakage current. It is therefore possible to check whether the short is present by virtue of the light emitting diode 1 or the first light emitting diode element 50 being operated in the off-state region, that is to say in reverse mode, and a check being performed to determine whether the current $I_R$ that flows in the off-state direction is larger than the prescribed leakage current.

The light emitting diode 1 and/or the first light emitting diode element 50 can be operated in the off-state region by means of the first actuating circuit 42, provided that said actuating circuit is designed for reverse operation. Further, the first actuating circuit 42 may be in a form such that it can record the actuating current $I_F$, the current $I_R$ in the off-state direction, the actuating voltage and/or the reverse voltage and thus can check whether or not the short is present. Alternatively or additionally, the first actuating circuit 42 may be electrically coupled to an evaluation unit and/or a computation unit, by means of which the signals of the first actuating circuit 42 can be received and evaluated, so that the evaluation unit or the computation unit can be used to ascertain whether or not the short is present.

If the short is present, then the first actuating circuit 42, the evaluation unit and/or the computation unit can initiate protective measures, for example can disconnect or bypass the damaged light emitting diode 1 or the damaged light emitting diode element 50 and/or can send a warning signal to a superordinate unit, for example a computer, for example an onboard computer of a vehicle, and/or can output a warning signal, for example an audible or visual warning signal, directly.

In test mode, a reverse voltage, particularly a moderate reverse voltage, is thus applied to the light emitting diode 1 or the light emitting diode element 50, or a moderate reverse current is impressed, in order to identify an abnormal reverse behavior. If the reverse voltage and the reverse current are moderate, then this means, by way of example, that the light emitting diode 1 or the light emitting diode element 50 is operated in the off-state region rather than in the on-state region, for example in a region that, in terms of absolute value, corresponds approximately to the forward voltage at the rated operating point. The moderate reverse voltage may be, by way of example, less than or equal, in terms of absolute value, to the rated voltage in forward mode. The rated voltage, that is to say the forward voltage, is the voltage that is advantageously applied to the light emitting diode 1 or the light emitting diode element 50 in normal forward mode. The forward voltage of unstacked OLEDs, for example, may be in a range from 3.5 V to 4.5 V, for example, in the case of singularly stacked OLEDs from 6 V to 7 V, for example, and in the case of triply stacked OLEDs from 10 V to 11 V, for example. If the OLED withstands higher voltages without damage in reverse mode, then the reverse voltage can also lie of a possible maximum output voltage of the first actuating circuit 42, in a range from, by way of example, 20 V to 120 V, for example from 30 V to 80 V, for example approximately 60 V or approximately 34 V.

Although OLEDs are in principle not intended for operation in the off-state region, that is to say reverse mode, the moderate reverse voltages in short pulses and/or for short periods do not cause any damage to the OLED and do not impair performance. The method can therefore involve the light emitting diode 1 or the first light emitting diode element 50 being operated in short pulses and/or for short periods in the off-state region. The short pulses or short periods could lie in a range from, by way of example, 0.1 ms to 1 s, for example from 1 ms to 100 ms, for example from 2.5 ms to 10 ms, for example from 4 ms to 5 ms. If the light emitting diode 1 or the light emitting diode element 50 is operated in pulsed fashion in forward mode, then the pulse duration can be chosen to be so short that the pulses in reverse mode lie completely in the pulse pauses of forward mode.

Figure 3:
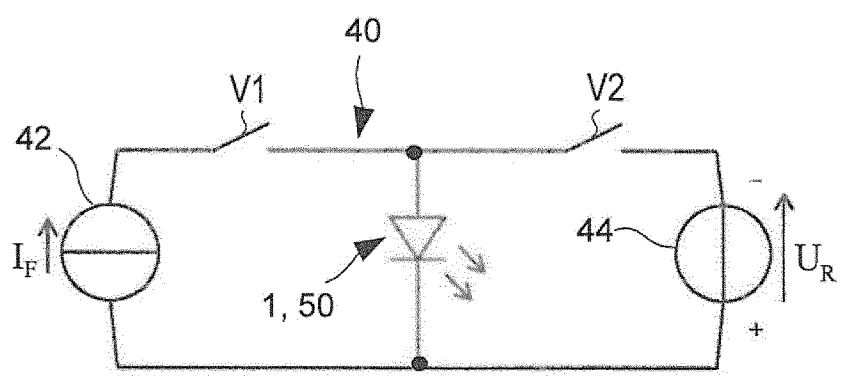
FIG. 3 shows a circuit diagram for an exemplary embodiment of an optoelectronic subassembly.

FIG. 3 shows an exemplary embodiment of an optoelectronic subassembly, which may largely correspond to optoelectronic subassembly shown in FIG. 2, for example. The optoelectronic subassembly has the electronic circuit 40 and the light emitting diode 1 or the first light emitting diode element 50. The electronic circuit 40 has the first actuating circuit 42 and a test voltage source 44.

The test voltage source 44 may, by way of example, be arranged if the first actuating circuit 42 is not designed to operate the light emitting diode 1 or the first light emitting diode element 50 in the off-state region. The test voltage source 44 is connected in series with the light emitting diode 1 and/or the first light emitting diode element 50. The electronic circuit 40 has a first connecting switch V1 that, in its first switching state, electrically connects the first actuating circuit 42 and the light emitting diode 1 or the first light emitting diode element 50, and hence is closed, and that, in its second switching state, electrically isolates the first actuating circuit 42 and the light emitting diode 1 or the first light emitting diode element 50 from one another, and hence is open. The electronic circuit 40 has a second connecting switch V2 that, in its first switching state, electrically connects the test voltage source 44 to the first light emitting diode 1 and/or the first light emitting diode element 50, and hence is closed, and that, in its second switching state, electrically isolates the test voltage source 44 from the light emitting diode 1 or the first light emitting diode element 50, and hence is open.

In the normal mode of the optoelectronic subassembly, the first connecting switch V1 is in its first switching state and the second connecting switch V2 is in its second switching state, so that the first actuating circuit 42 is electrically connected in series with the light emitting diode 1 and/or the first light emitting diode element 50, and the test voltage source 44 is electrically isolated from the light emitting diode 1 or the first light emitting diode element 50.

In a test mode, the first connecting switch V1 is in its second switching state and the second connecting switch V2 is in its first switching state, so that the first actuating circuit 42 is electrically isolated from the light emitting diode 1 and/or the first light emitting diode element 50, and the test voltage source 44 is electrically connected in series with the light emitting diode 1 and/or the first light emitting diode element 50. The test voltage source 44 is used to apply a reverse voltage $U_R$ to the light emitting diode 1 and/or the first light emitting diode element 50. If, in the test mode, the current $I_R$ flows via the light emitting diode 1 or the first light emitting diode element 50 in the off-state direction and this current $I_R$ is larger than the prescribed leakage current, then the light emitting diode 1 or the first light emitting diode element 50 has the short.

As an alternative to the test voltage source 44, a test current source, which is not shown in FIG. 3, may be arranged that can be used to operate the light emitting diode 1 and/or the first light emitting diode element 50 in the off-state region. The current $I_R$ in the off-state direction can, by way of example, be recorded by means of the test voltage source 44 or by means of a test current recording apparatus, which is not shown in FIG. 3. The check to determine whether the current $I_R$ flows in the off-state direction and is larger than the prescribed leakage current can be checked, by way of example, using the evaluation unit and/or computation unit explained above.

Figure 4:
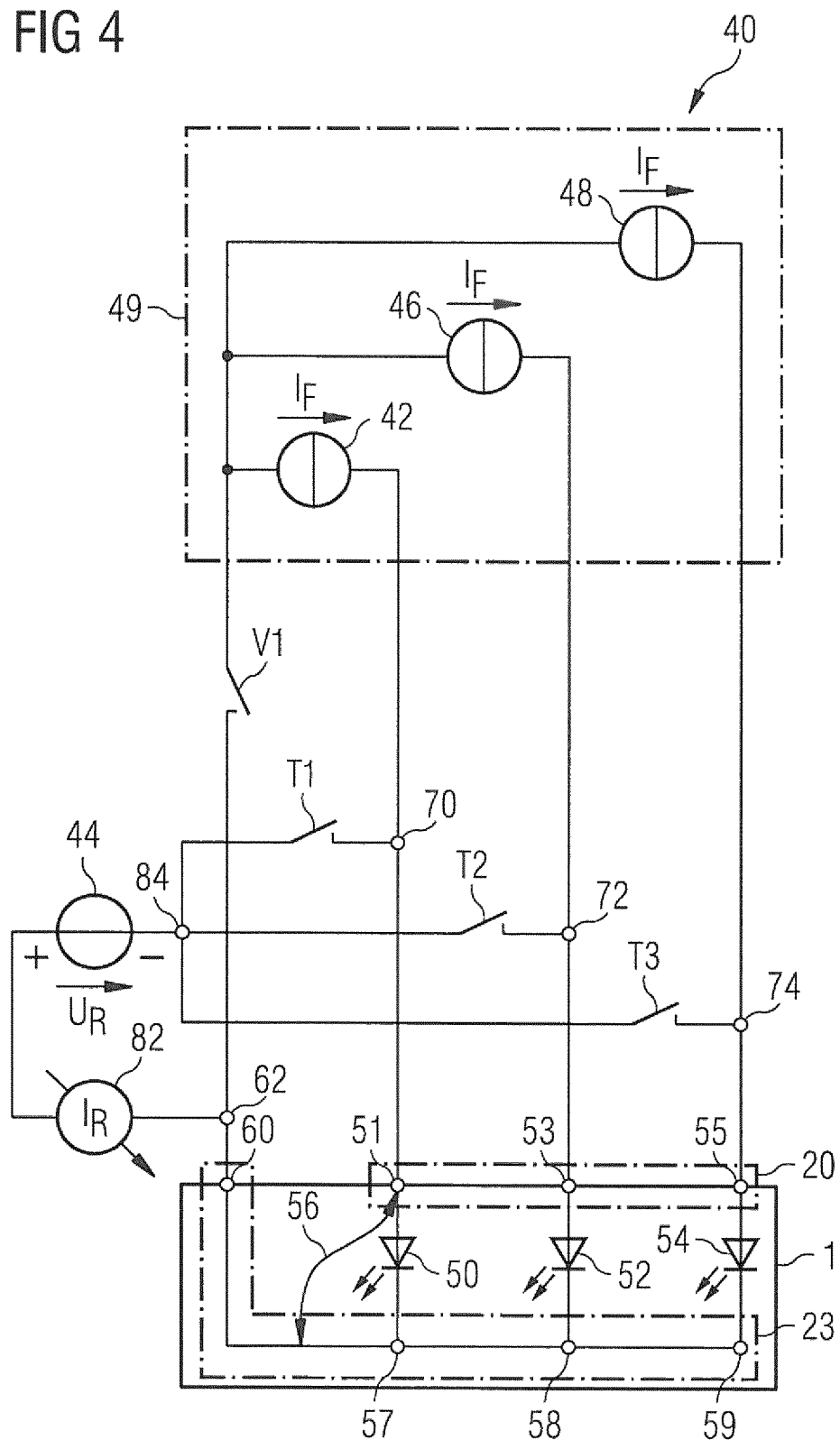
FIG. 4 shows a circuit diagram for an exemplary embodiment of an optoelectronic subassembly.

FIG. 4 shows a circuit diagram for an exemplary embodiment of an optoelectronic subassembly that has at least one light emitting diode, for example the light emitting diode 1 explained above. The light emitting diode 1 has the first light emitting diode element 50, the second light emitting diode element 52 and the third light emitting diode element 54. Alternatively, the light emitting diode 1 can also have only two light emitting diode elements 50, 52 or more than three light emitting diode elements 50, 52, 54. Further, as an alternative or in addition to the one light emitting diode 1 with the light emitting diode elements 50, 52, 54, there may be two or more light emitting diodes 1 arranged with or without light emitting diode elements 50, 52, 54 and electrically connected in parallel with the light emitting diode 1 or the light emitting diode elements 50, 52, 54, for example.

The first light emitting diode element 50 has the first electrode 51 and a second electrode 57 of the first light emitting diode element 50. The second electrode 57 of the first light emitting diode element 50 is electrically coupled to the second electrode layer 23 of the light emitting diode 1. The second electrode 57 of the first light emitting diode element 50 may, by way of example, be in integral form with the second electrode layer 23 of the light emitting diode 1 and/or form a part thereof.

The second light emitting diode element 52 has the first electrode 53 and a second electrode 58 of the second light emitting diode element 52. The second electrodes 57, 58 of the first and second light emitting diode elements 50, 52 are electrically coupled to one another. The second electrode 58 of the second light emitting diode element 52 is electrically coupled, by way of example, to the second electrode layer 23 of the light emitting diode 1. The second electrode 58 of the second light emitting diode element 52 may, by way of example, be in integral form with the second electrode layer 23 of the light emitting diode 1 and/or form a part thereof.

The third light emitting diode element 54 has the first electrode 55 and a second electrode 59 of the third light emitting diode element 54. The second electrode 59 of the third light emitting diode element 54 is electrically coupled to the second electrode 57 of the first light emitting diode element 50 and/or the second electrode 58 of the second light emitting diode element 52. The second electrode 59 of the third light emitting diode element 54 is, by way of example, electrically coupled to the second electrode layer 23 of the light emitting diode 1. The second electrode 59 of the third light emitting diode element 54 may, by way of example, be in integral form with the second electrode layer 23 of the light emitting diode 1 and/or form a part thereof.

By way of example, the second electrodes 57, 58, 59 may be directly electrically coupled to one another, for example the second electrodes 57, 58, 59 may be in integral form and/or may be formed by the second electrode layer 23 of the light emitting diode 1. Alternatively or additionally, the first electrodes 51, 53, 55 may be directly electrically coupled to one another and/or in integral form and/or formed by the first electrode layer 20.

The electronic circuit 40 has a second actuating circuit 46 and/or a third actuating circuit 48. The electronic circuit 40 has a first node 62, a second node 70, a third node 72, a fourth node 74 and a fifth node 84. The electronic circuit 40 has a first test switch T1, a second test switch T2 and/or a third test switch T3 and the first connecting switch V1.

The first test switch T1, in its first switching state, electrically couples the fifth node 84 and the second node 70 to one another and, in its second switching state, electrically isolates said nodes from one another. The second test switch T2, in its first switching state, electrically couples the fifth node 84 and the third node 72 to one another and, in its second switching state, electrically isolates said nodes from one another. The third test switch T3, in its first switching state, electrically couples the fifth node 84 and the fourth node 74 to one another and, in its second switching state, electrically isolates said nodes from one another.

The second electrodes 57, 58, 59 are electrically coupled to the first node 62 of the electronic circuit 40 via an optional first contact point 60. The first node 62 is electrically coupled to an input of the first actuating circuit 42 via the first connecting switch V1 on the basis of the switching position of the first connecting switch V1. An output of the first actuating circuit 42 is electrically coupled to the second node 70, for example via the first protective diode 64. The second node 70 is electrically coupled to the first electrode 51 of the first light emitting diode element 50.

An input of the second actuating circuit 46 is electrically coupled to the first node 62 via the first connecting switch V1 on the basis of the switching position of the first connecting switch V1. An output of the second actuating circuit 46 is electrically coupled to the third node 72, for example via the second protective diode 66. The third node 72 is electrically coupled to the first electrode 53 of the second light emitting diode element 52. The second actuating circuit 46 is used, in the normal mode of the optoelectronic subassembly, to actuate, to regulate and/or to operate the second light emitting diode element 52. The second actuating circuit 46 can also be referred to as a second driver.

An input of the third actuating circuit 48 is electrically coupled to the first node 62 via the first connecting switch V1 on the basis of the switching position of the first connecting switch V1. An output of the third actuating circuit 48 is electrically coupled to the fourth node 74, for example via the third protective diode 68. The fourth node 74 is electrically coupled to the first electrode 55 of the third light emitting diode element 54. The third actuating circuit 48 is used, in the normal mode of the optoelectronic subassembly, for actuating, regulating and/or operating the third light emitting diode element 54.

The first actuating circuit 42, the second actuating circuit 46 and/or the third actuating circuit 48 may, by way of example, be integrated in a common control unit 49. The control unit 49 can have only one or two of the actuating circuits 42, 46, 48 or more actuating circuits 42, 46, 48 for actuating correspondingly fewer or more light emitting diode elements 50, 52, 54. If need be, the electronic circuit 40 can have fewer or more protective diodes 64, 66, 68 and/or test switches T1, T2, T3. The control unit 49 is used for actuating, regulating and/or operating the light emitting diode 1.

The electronic circuit 40 has the test voltage source 44 and a test current recording apparatus 82. The test voltage source 44 and the test current recording apparatus 82 are electrically connected in series between the first node 62 and the fifth node 84.

In a normal mode of the optoelectronic subassembly, the test switches T1, T2, T3 are in their second switching position, and are therefore open, the first connecting switch V1 is in its first switching state, and is therefore closed, and the first, second and/or third actuating circuit 42, 46, 48 operate, that is to say control or regulate, the corresponding light emitting diode elements 50, 52, 54 in the on-state direction in each case, so that said light emitting diode elements emit light, the light emitting diode elements 50, 52, 54 being able to be actuated identically or differently. By way of example, the light emitting diode elements 50, 52, 54 can be operated at the same time, at overlapping times or alternately, so that different light scenarios, for example two-dimensional continuous light or two-dimensional flashing light or locally alternating flashing light, can be produced. Further, different actuation of the light emitting diode elements 50, 52, 54 can also produce different brightnesses of the light.

In a test mode for checking whether one of the light emitting diode elements 50, 52, 54 has a short, it is first of all possible for all actuating circuits 42, 46, 48 to be operated in nonactive mode, that is to say to be switched off, and the first connecting switch V1 can be switched to its second switching state, that is to say opened. In order to check whether the first light emitting diode element 50 has a short, for example, the first test switch T1 is switched to its first switching state and hence closed and the second and third test switches T2, T3 remain in their second switching state. Subsequently, the test voltage source 44 can be used to apply the reverse voltage $U_R$ to the first light emitting diode element 50 in the off-state direction. The test current recording apparatus 82 can then be used to record the current $I_R$ in the off-state direction if need be. Alternatively, the test voltage source 44 can be used to record the current $I_R$ in the off-state direction if need be, if said test voltage source is designed for that purpose. Further, the evaluation unit, not represented, can be used to check whether the recorded current $I_R$ in the off-state direction is larger than the prescribed leakage current. The current $I_R$ in the off-state direction can, by way of example, flow via a current path 56, via which the short occurs, between the first electrode 51 of the first light emitting diode element 50 and the second electrode layer 23. If the current $I_R$ in the off-state direction is larger than the prescribed leakage current, then the short is identified. Optionally, it is subsequently possible for the first actuating circuit 42 to be switched off, so that the first light emitting diode element 50 with the short does not continue to be operated. The two other light emitting diode elements 52, 54 that have no short can continue to be operated normally.

To check the second light emitting diode element 52, the second test switch T2 can be switched to its first switching state and the first and third test switches T1 and T3 can be switched to their second switching state. To check the third light emitting diode element 54 the third test switch T3 can be switched to its first switching state and the first and second test switches T1, T2 can be switched to their second switching state.

Figure 5:
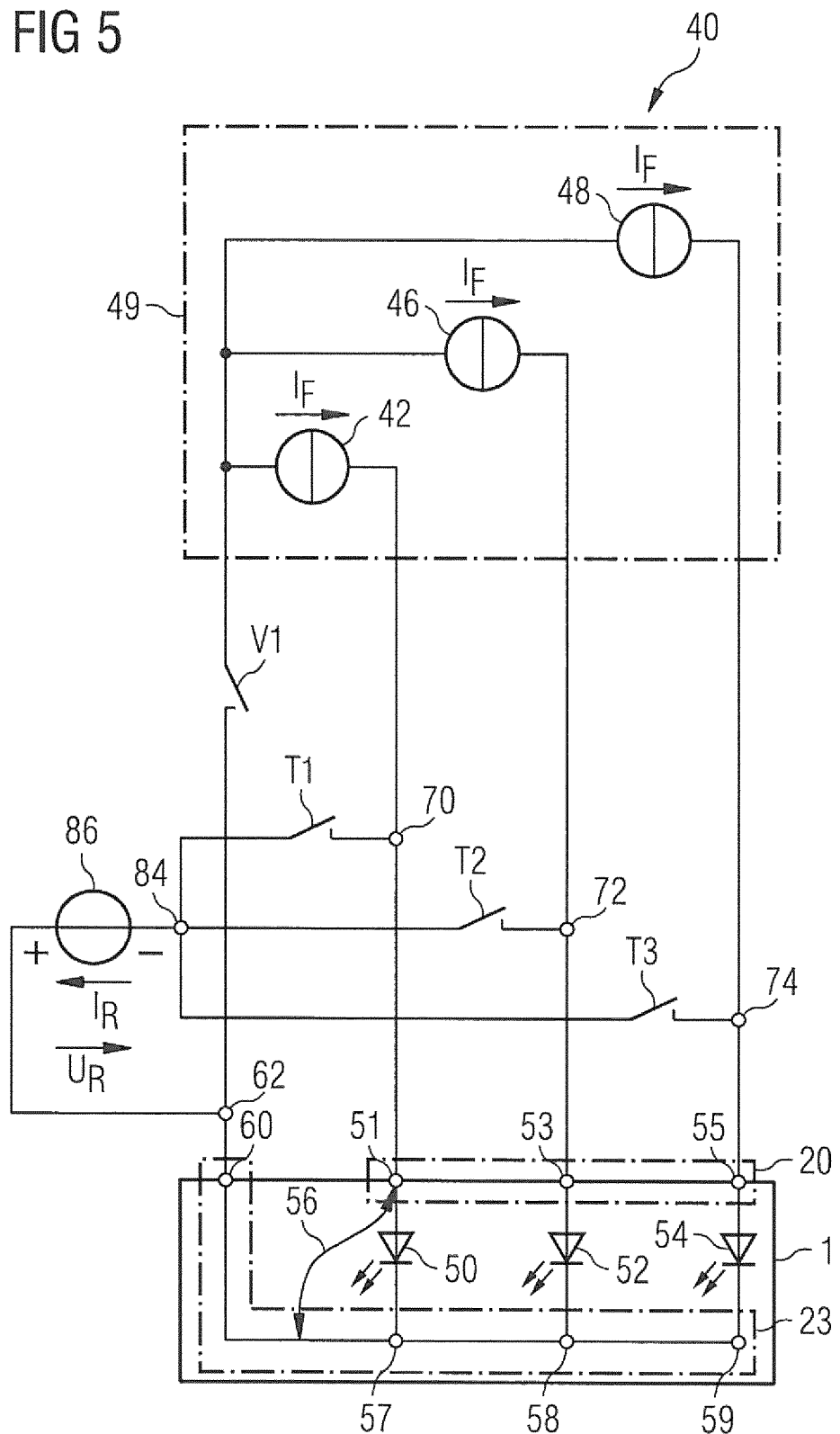
FIG. 5 shows a circuit diagram for an exemplary embodiment of an optoelectronic subassembly.

FIG. 5 shows a circuit diagram for an exemplary embodiment of an optoelectronic subassembly that, by way of example, can largely correspond to the optoelectronic subassembly shown in FIG. 4. The optoelectronic subassembly has a test current source 86 that is electrically connected between the first node 62 and the fifth node 84. The test current source 86 can be used, instead of using the test voltage source 44, to impress the current $I_R$ in the off-state direction into one or more of the light emitting diode elements 50, 52, 54, specifically on the basis of the switching state of the test switches T1, T2, T3. To check whether the short is present, the reverse voltage $U_R$ can be recorded. The reverse voltage $U_R$ can, by way of example, be recorded using a test voltage recording apparatus provided specifically for the purpose or using electronics of the test current source 86, if the latter is designed for that purpose. The reverse voltage $U_R$ is, in this case, representative of the current $I_R$ in the off-state direction. In other words, the reverse voltage $U_R$ can be used to indirectly check whether the current $I_R$ flows in the off-state direction and is larger than the prescribed leakage current.

By way of example, the first light emitting diode element 50 can be checked for the short when the first test switch T1 is in its first switching state, that is to say is closed, and the second and third test switches T2, T3 are in their second switching state, that is to say are open. The second light emitting diode element 52 can be checked for the short when the second test switch T2 is in its first switching state and the first and third test switches T1, T3 are in their second switching state. The third light emitting diode element 54 can be checked for the short when the third test switch T3 is in its first switching state and the first and second test switches T1, T2 are in their second switching state. When the light emitting diode 1 is checked for the short, all actuating circuits 42, 46, 48 are in a switched-off condition.

Figure 6:
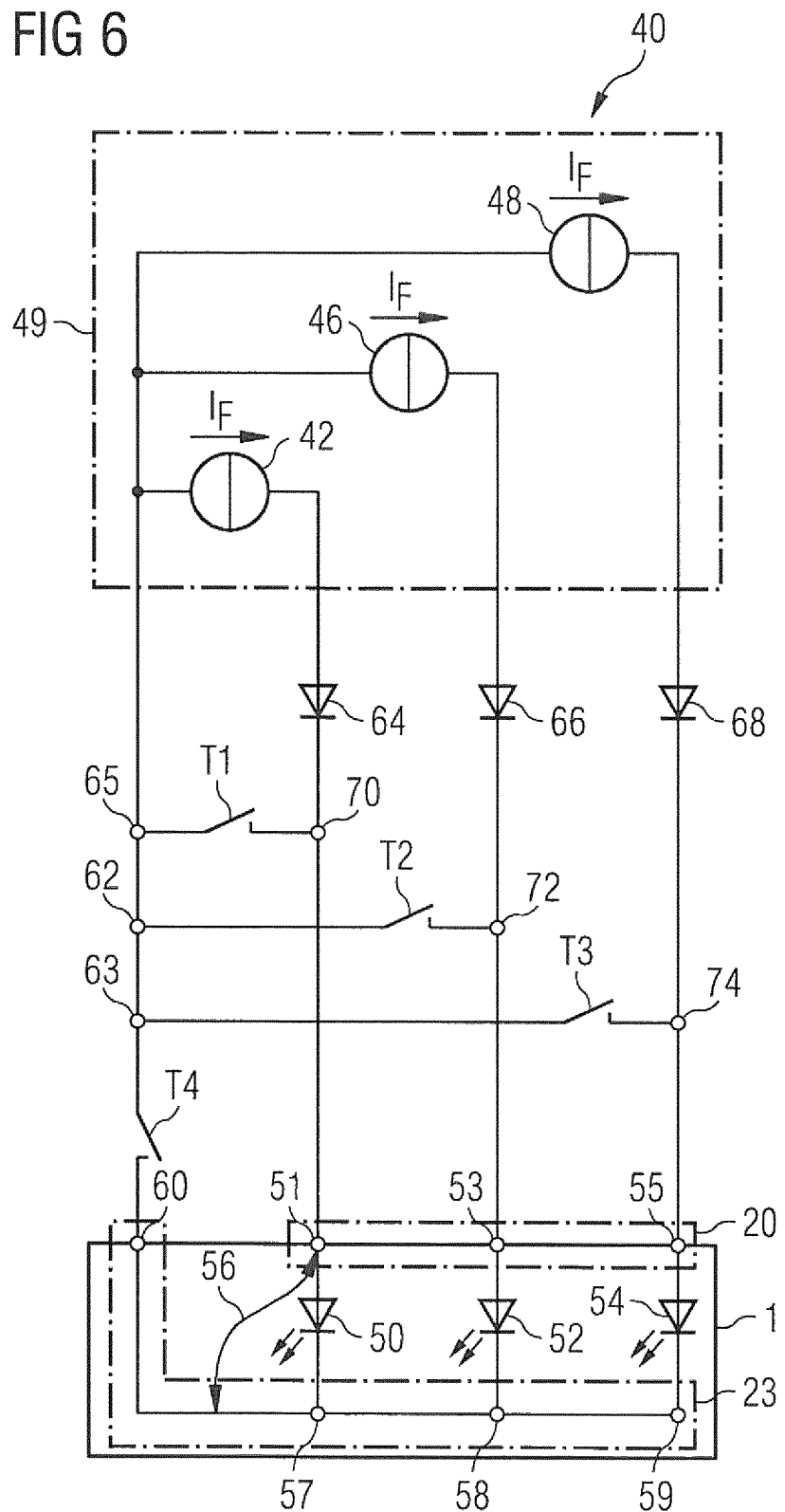
FIG. 6 shows a circuit diagram for an exemplary embodiment of an optoelectronic subassembly.

FIG. 6 shows a circuit diagram for an exemplary embodiment of an optoelectronic subassembly that, by way of example, can largely correspond to the optoelectronic subassembly explained above. The optoelectronic subassembly has, instead of the test voltage source 44 and the test current source 86 and the fifth node 84, an isolating switch T4. The isolating switch T4 is electrically coupled firstly via a first contact point 63 to the first node 62 and secondly to the second electrode layer 23 of the light emitting diode 1. In particular, the isolating switch T4, in its first switching state, electrically connects the first node 62 and the second electrode layer 23 and, in its second switching state, isolates the first node 62 and the second electrode layer 23 from one another. In the normal mode of the optoelectronic subassembly, the isolating switch T4 is in its first switching state and is therefore closed.

The first test switch T1 is electrically coupled firstly via a second contact point 65 to the first node 62 and secondly to the second node 70. The first test switch T1, in its first switching state, electrically connects the first and second nodes 62, 70 and, in its second switching state, electrically isolates said nodes from one another. The second test switch T2 is electrically coupled firstly to the first node 62 and secondly to the third node 72. The second test switch T2, in its first switching state, electrically connects the first and third nodes 62, 72 and, in its second switching state, electrically isolates said nodes from one another. The third test switch T3 is electrically coupled firstly via the first contact point 63 to the first node 62 and secondly to the fourth node 74. The first test switch T1, in its first switching state, electrically connects the first and fourth nodes 62, 74 and, in its second switching state, electrically isolates said nodes from one another.

The electronic circuit 40 optionally has a first protective diode 64, a second protective diode 66 and/or a third protective diode 68. The protective diodes 64, 66, 68 prevent, in test mode, for identifying the short, a current from flowing in the off-state direction via the corresponding actuating circuit 42, 46, 48. Alternatively, the actuating circuits 42, 46, 48 themselves can have an appropriate protective apparatus and/or protective function, which prevent, in test mode, for identifying the short, the current from flowing in the off-state direction via the corresponding actuating circuit 42, 46, 48.

To check whether there is a short in the light emitting diode 1, all actuating circuits 42, 46, 48 are first of all switched off. To check the first light emitting diode element 50, for example, the first test switch T1 is switched to its first switching state and the second test switch T2, the third test switch T3 and the isolating switch T4 are switched to their second switching state, that is to say opened. The second actuating circuit 46 is switched on. If there is a short in the case of the first light emitting diode element 50, then the electric current $I_F$ flows in the forward direction via the protective diode 66, via the second light emitting diode element 52 and via the current path 56 of the short in the off-state direction via the first light emitting diode element 50 and via the second node 70 and the first node 62 to the input of the second actuating circuit 46. If there is no short in the case of the first light emitting diode element 50, then the latter blocks the flow of current and, except for the leakage current, it is not possible for a current to flow in the off-state direction via the first light emitting diode element 50.

To record the current in the off-state direction, it is possible, by way of example, for a current measuring apparatus provided specifically for the purpose to be provided that, by way of example, may be connected in series with the second actuating circuit 46. Alternatively, the second actuating circuit 46 may be designed such that it can be used to record the current $I_F$ in the forward direction via the second light emitting diode element 52 or the current $I_R$ in the off-state direction via the first light emitting diode element 50, at least if said current is larger than the prescribed leakage current. By way of example, the second actuating circuit 46 may be designed such that in test mode, when the first light emitting diode element 50 is intact, the lack of a flow of current means that the actuating voltage increases, for example up to an actuating voltage threshold value, and the first actuating circuit 42 itself and/or the evaluation unit, not represented, can then be used to identify that the actuating voltage reaches and/or even exceeds this actuating voltage threshold value. In test mode, there is no short in this case. By contrast, in test mode, it is possible to infer that the short is present if the actuating voltage does not reach the actuating voltage threshold value.

Hence, the second actuating circuit 46, which is provided in normal mode for actuating the second light emitting diode element 52, can be used in test mode to operate the first light emitting diode element 50 in the off-state region. This concept can also be transferred to the other light emitting diode elements 52, 54 and actuating circuits 42, 48. By way of example, the second actuating circuit 46 or the first actuating circuit 42 can be used to check the third light emitting diode element 54, and/or the third actuating circuit 48 can be used to check the first and/or second light emitting diode element 50, 52, and/or the first actuating circuit 42 can be used to check the second and/or third light emitting diode element 54, on the basis of the switching states of the first test switch T1, the second test switch T2 and the third test switch T3.

Figure 7:
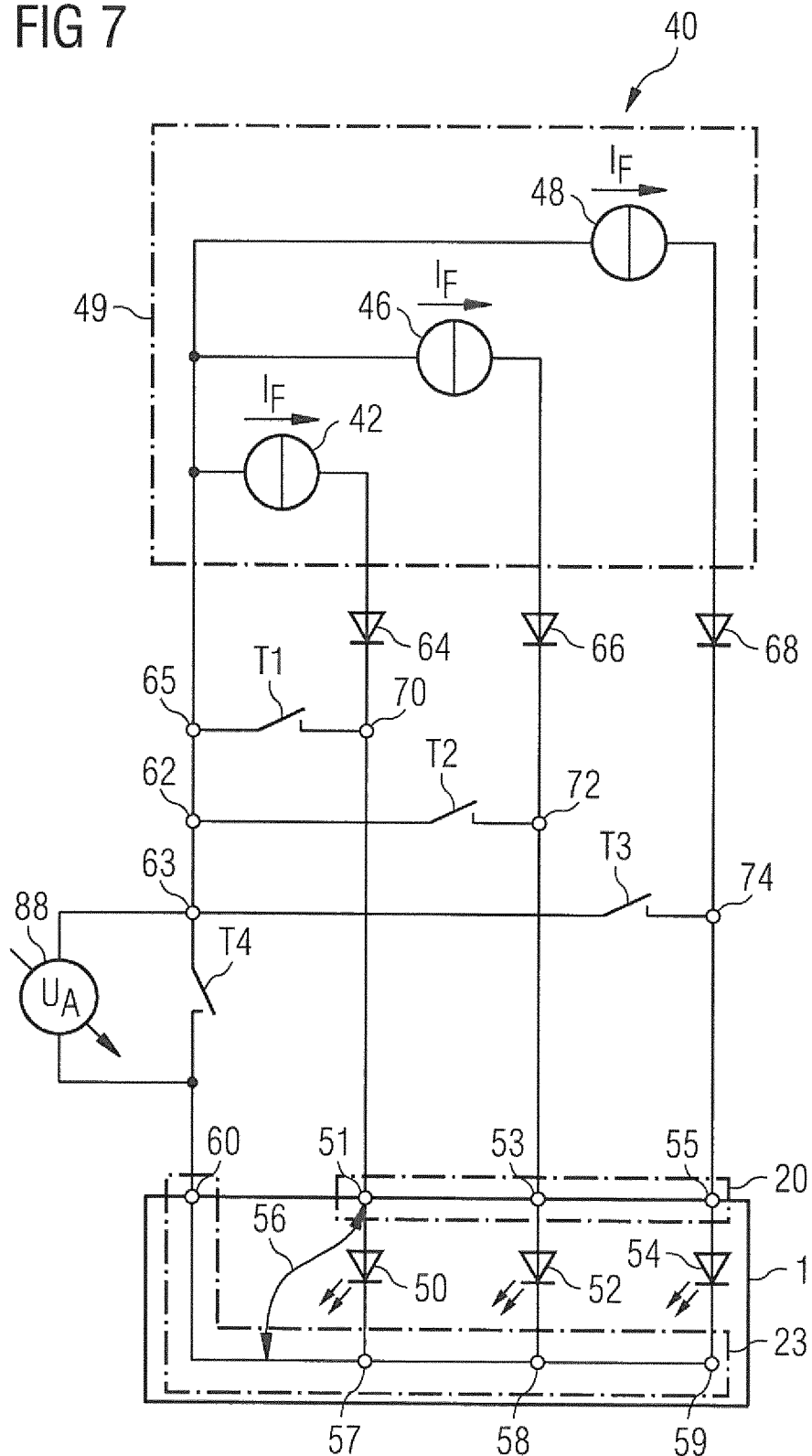
FIG. 7 shows a circuit diagram for an exemplary embodiment of an optoelectronic subassembly.

FIG. 7 shows a circuit diagram for an exemplary embodiment of an optoelectronic subassembly that, by way of example, can largely correspond to the optoelectronic subassembly shown in FIG. 6. Arranged between the second electrode layer 23 and the first node 62 is an analysis voltage recording apparatus 88 for recording an analysis voltage $U_A$ between the second electrode layer 23 of the light emitting diode 1 and the first node 62. The analysis voltage $U_A$ can be used to ascertain an energy distribution at the short, particularly a power P that is dropped across the short. The power P across the short is obtained from the following equation:

$$P = I_F \times (U_A - (I_F \times R\_T))$$

where $I_F$ is the current in the forward direction of the actuating circuit 42, 46, 48 activated for the test and $R\_T$ is the electrical resistance of the corresponding test switch T1, T2, T3 that is in its first switching state, that is to say closed.

If the voltage across the isolating switch T4 is referenced to a base voltage of the electronic circuit 40, for example to a ground potential, and the ground potential is applied to the first node 62, for example, then a very inexpensive implementation is possible. By way of example, in the case of the evaluation unit or computation unit for switching the switches T1 to T4 and/or for actuating the actuating circuits 42, 46, 48 and/or for identifying the short, only one output and one input is needed on the microcontroller, since each of the switches T1, T2, T3, the actuating circuits 42, 46, 48 and the analysis voltage recording apparatus 88 are referenced to the same potential. The microcontroller may be an element of the control unit 49, for example.

Figure 8:
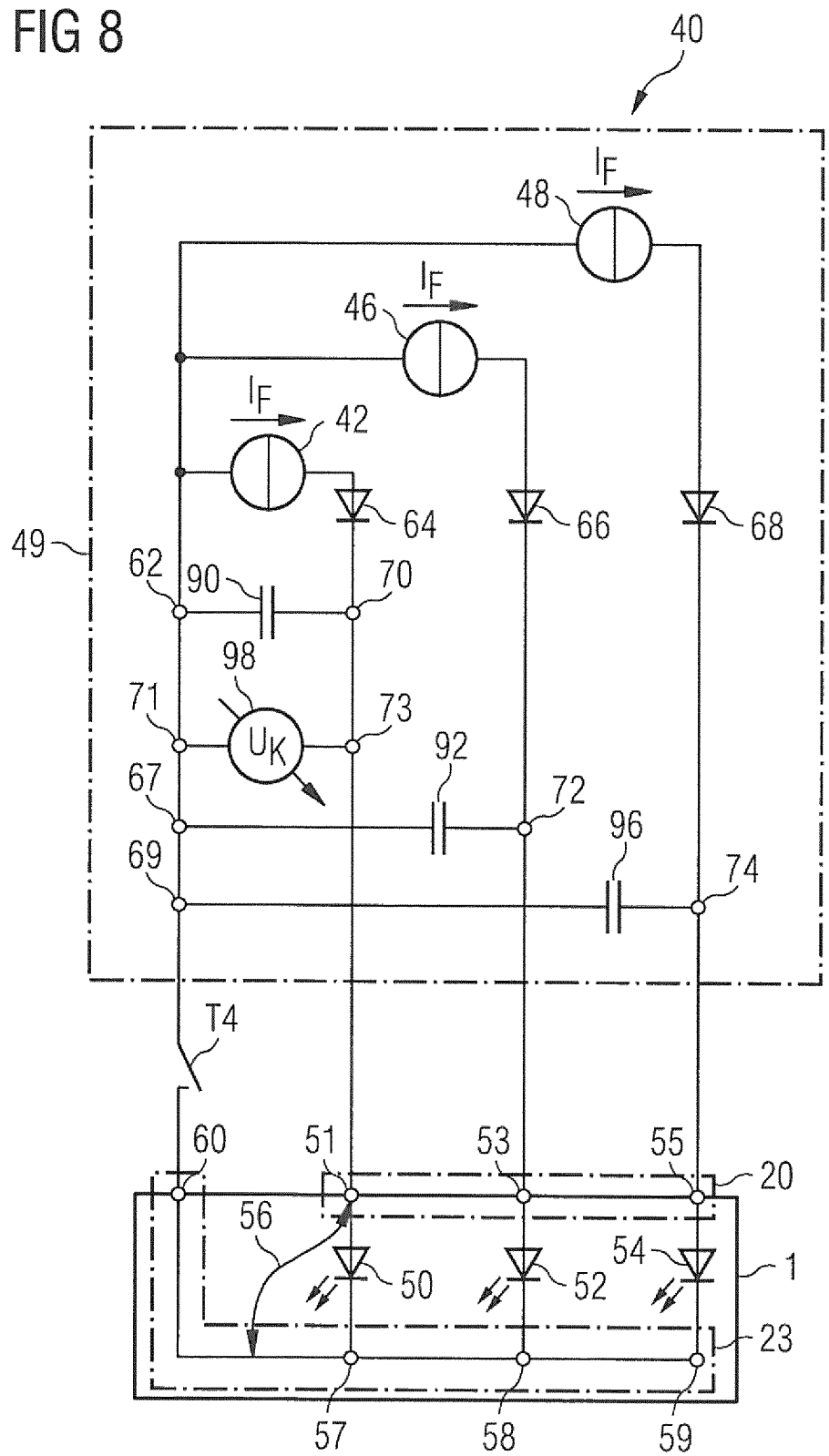
FIG. 8 shows a circuit diagram for an exemplary embodiment of an optoelectronic subassembly.

FIG. 8 shows a circuit diagram for an exemplary embodiment of an optoelectronic subassembly that, for example, can largely correspond to one of the optoelectronic subassemblies explained above. The first node 62 and the second node 70 have a first capacitor 90 electrically connected between them. Additionally, there may also be a second capacitor 92 electrically connected via a third contact point 67 between the first node 62 and the third node 72 and/or a third capacitor 96 electrically connected via a fourth contact point 69 between the first node 62 and the fourth node 74. The first capacitor 90 has a capacitor voltage recording apparatus 98 electrically connected in parallel with it via a fifth contact point 71 and a sixth contact point 73 between the first node 62 and the second 70, said capacitor voltage recording apparatus 98 being able to be used to record a capacitor voltage $U_K$ that is present across the first capacitor 90. Additionally, there may also be further capacitor voltage recording apparatuses arranged that, by way of example, are connected in parallel with the second capacitor 92 and/or in parallel with the third capacitor 96 and are each used for recording capacitor voltages of the relevant capacitor 92, 96.

To check whether the short is present in the first light emitting diode element 50, for example, the second and third actuating circuits 46, 48 are switched off and the isolating switch T4 is or remains closed. The first actuating circuit 42 is or remains switched on at first, wherein an actuating voltage of the first actuating circuit 42 is set to a voltage below the threshold voltage of the first light emitting diode element 50, for example to zero or a value between zero and the threshold voltage. As a result, a current flows via an input of the first capacitor 90, specifically such that a determined capacitor voltage $U_K$ is present across the first capacitor 90.

Subsequently, the first actuating circuit 42 is switched off, for example after 1 ms. Thereafter, the isolating switch T4 is opened. The second actuating circuit 46 is then switched on, specifically with a voltage limit, for example to no more than one-and-a-half times to three times, for example twice, the rated value of the actuating voltage in normal mode. Alternatively, the second actuating circuit 46 can be switched on first and then the isolating switch T4 can be opened. Then the capacitor voltage $U_K$ is monitored in parallel therewith. If the short is present in the case of the first light emitting diode element 50, then the first capacitor 90 is charged by means of the second actuating circuit 46 via the current path 56 of the short, and the capacitor voltage $U_K$ rises, specifically to no more than the actuating voltage that the second actuating circuit 64 provides, minus the voltages that are present across the second protective diode 66 and the second light emitting diode element 52. If the capacitor voltage $U_K$ decreases or remains the same, however, then there is no short in the case of the first light emitting diode element 50. The capacitor voltage $U_K$ can be evaluated by means of the evaluation unit and/or the computation unit, for example.

In the exemplary embodiments of the optoelectronic subassembly that are cited prior to FIG. 8, a current flows via the short-circuit path 56 when the short is present in the test mode. This current can flow throughout the test mode. By contrast, in the exemplary embodiment of the optoelectronic subassembly that is shown in FIG. 8, a significant current flows via the short-circuit path 56 only very briefly, specifically until the corresponding capacitor 90, 92, 96 is charged.

Figure 9:
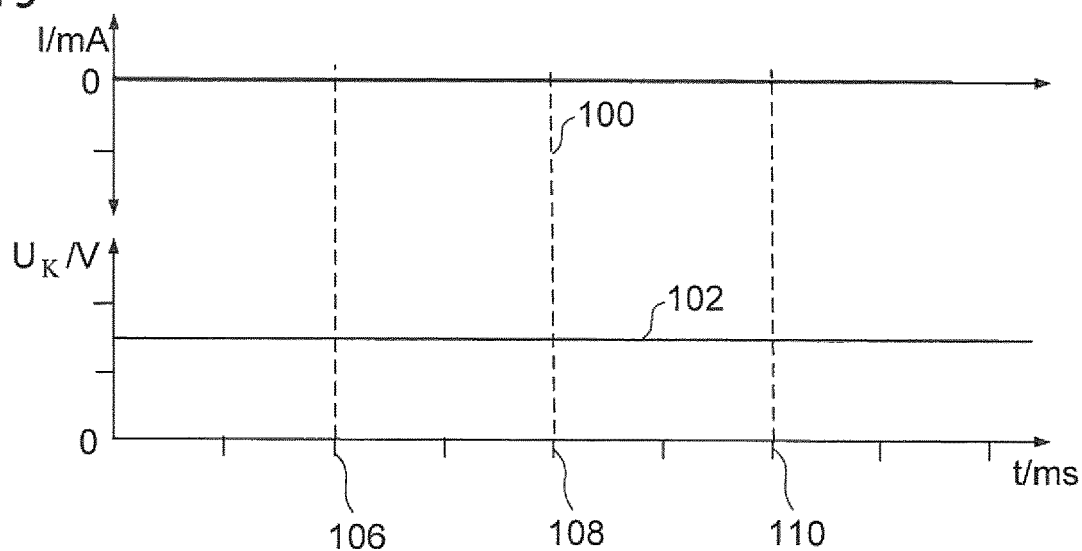
FIG. 9 shows an exemplary profile for a current and an exemplary profile for a capacitor voltage.

FIG. 9 shows an exemplary profile 100 of a current I at an output of the first capacitor 90 and an exemplary profile 102 of the capacitor voltage $U_K$ if there is no short.

Initially, the first actuating circuit 42 is used to operate the first light emitting diode element 50 in the on-state direction below its threshold voltage, and the first capacitor 90 is already charged to the determined capacitor voltage $U_K$, for which reason the current I is equal to zero and the capacitor voltage $U_K$ is constant. In particular, the capacitor voltage $U_K$ corresponds to the actuating voltage of the first actuating circuit 42 minus the voltage that is dropped across the first protective diode 64.

At a first time 106, the first actuating circuit 42 is switched off. Approximately no current I flows via the first capacitor 90, and the capacitor voltage $U_K$ remains approximately the same, since the first protective diode 64 and the first light emitting diode element 56 prevent a significant flow of current below the threshold voltage.

At a second time 108, the isolating switch T4 is opened, as a result of which the second electrode layer 23 of the light emitting diode 1 is isolated from the first node 62. The capacitor voltage $U_K$ and the current I remain approximately unaltered.

At a third time 110, the second actuating circuit 46 is activated, with the current I and the capacitor voltage UK continuing to remain approximately the same, specifically on account of the blocking effect of the first light emitting diode element 50 free of a short.

If the current I and/or the capacitor voltage $U_K$ remain the same or remain approximately the same, then this means that leakage currents occurring from nonideal components, for example via the bulk resistances of the diodes 64, 66, 68, 50, 52, 54, are ignored. In other words, small currents I in the picoamp or microamp range and corresponding small changes in the capacitor voltage $U_K$ can arise, but these are negligible in this case.

Figure 10:
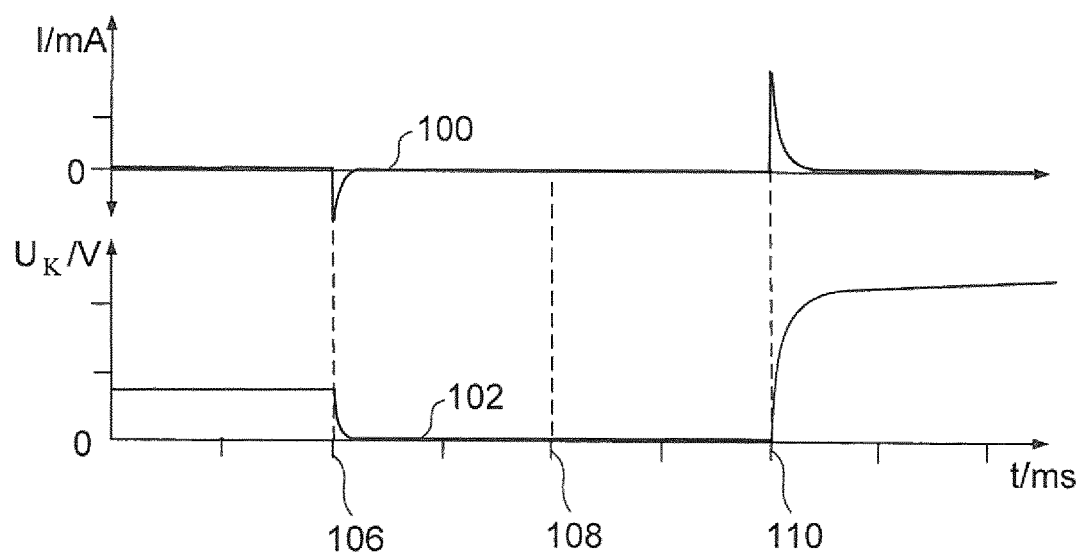
FIG. 10 shows an exemplary profile for a current and an exemplary profile for a capacitor voltage.

FIG. 10 shows an exemplary profile 100 of a current I at an output of the first capacitor 90 and an exemplary profile 102 of the capacitor voltage $U_K$ if the short is present in the case of the first light emitting diode element 50.

Initially, the first actuating circuit 42 is used to operate the first light emitting diode element 50 in the on-state direction below its threshold voltage. The first capacitor 90 is already charged to the determined capacitor voltage $U_K$, and the current I is equal to zero.

At the first time 106, the first actuating circuit is switched off. The capacitor voltage UK drops to 0, since the first capacitor 90 discharges via the short.

At the second time 108, the second electrode layer 23 and the first node 62 are electrically isolated from one another by means of the isolating switch T4, with neither the flow of current nor the capacitor voltage UK altering significantly.

At the third time 110, the second actuating circuit 46 is activated, wherein the first capacitor 90 charges via the short and the capacitor voltage $U_K$ rises. This rise in the capacitor voltage $U_K$ can be used for identifying the short. Alternatively or additionally, the drop in the capacitor voltage $U_K$ at the first time 106 can be used for identifying the short, but the general reason for this drop is that a diode with a short also exhibits atypical behavior in respect of the threshold voltage and, in particular, a current $I_F$ flows in the on-state direction below the threshold voltage.

Figure 11:
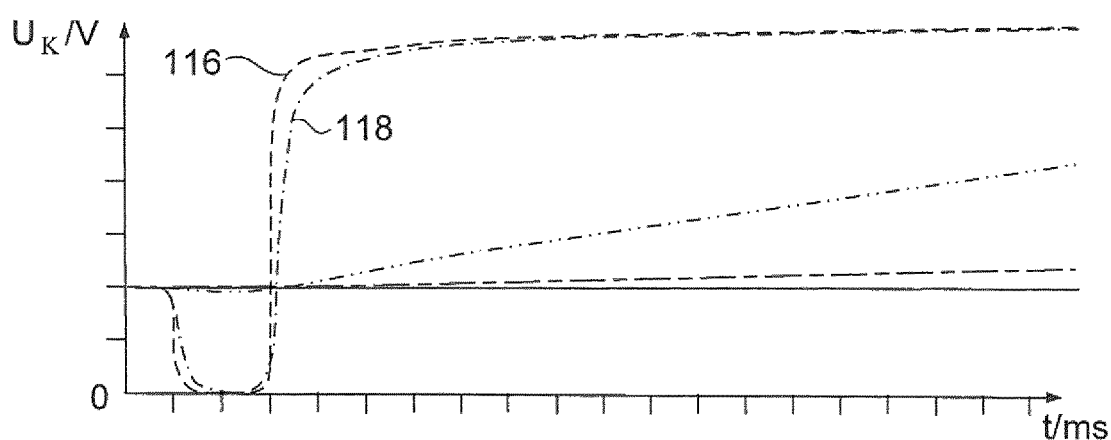
FIG. 11 shows multiple exemplary profiles for a capacitor voltage.

FIG. 11 shows multiple profiles of the capacitor voltage $U_K$ for resistances R of different magnitude for the short. For the identification of the short, a threshold value can be set, for example such that only shorts having resistances R of, by way of example, less than or equal to 1 kΩ, for example less than or equal to 100Ω, for example less than or equal to 50Ω, for example less than or equal to 20Ω, for example less than or equal to 10Ω, are identified as a short, and shorts having resistances R of, by way of example, greater than 10Ω, for example greater than 20Ω, for example greater than 50Ω, for example greater than 100Ω, for example greater than 1 kΩ, are not yet identified as a short. By way of example, shorts having a corresponding resistance R can cause no or only negligible problems, for example a temperature rise in the case of a short having a corresponding resistance R can bring about no to only a negligible local temperature increase, which is why such a short still does not present a problem or presents only negligible problems.

Figure 12:
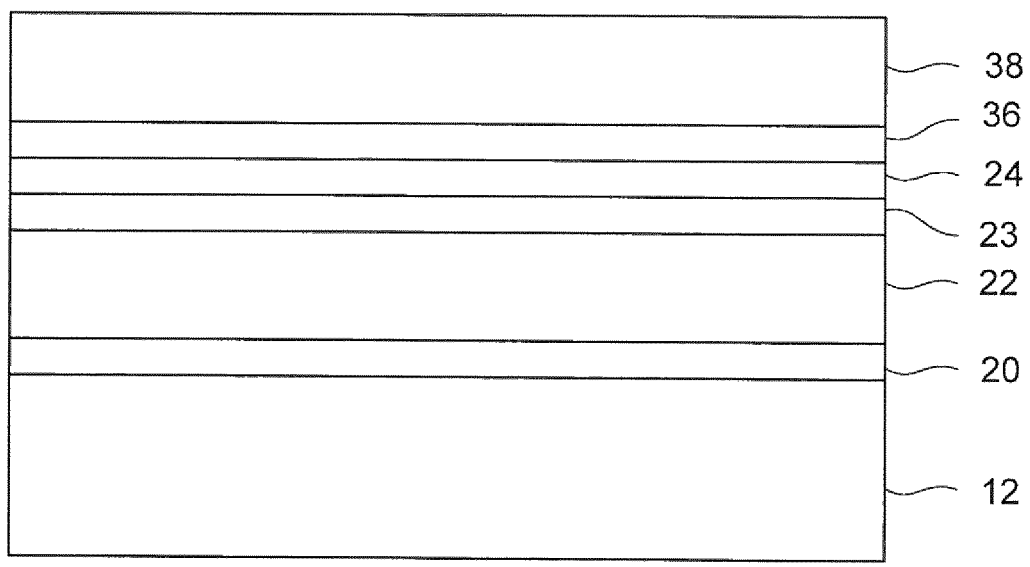
FIG. 12 shows a detailed sectional representation of a layer structure of an exemplary embodiment of a light emitting diode.

FIG. 12 shows a detailed sectional representation of a layer structure of an exemplary embodiment of a light emitting diode, for example the light emitting diode 1 explained above, for example one of the light emitting diode elements 50, 52, 54. The light emitting diode 1 may be in the form of a top emitter and/or bottom emitter. If the light emitting diode 1 is in the form of a top emitter and a bottom emitter, then the light emitting diode 1 can be referred to as an optically transparent light emitting diode.

The light emitting diode 1 has the support 12 and an active region above the support 12. The support 12 and the active region can have a first barrier layer, not represented, for example a first barrier thin-film layer, formed between them. The active region has the first electrode layer 20, the organic functional layer structure 22 and the second electrode layer 23. Formed above the active region is the encapsulation layer 24. The encapsulation layer 24 may be in the form of a second barrier layer, for example in the form of a second barrier thin-film layer. Arranged above the active region and possibly above the encapsulation layer 24 is the cover body 38. The cover body 38 may, by way of example, be arranged on the encapsulation layer 24 by means of an adhesive agent layer 36.

The active region is an electrically and/or optically active region. The active region is, by way of example, the region of the light emitting diode 1 in which electric current for operating the light emitting diode 1 flows and/or in which electromagnetic radiation is produced or absorbed.

The organic functional layer structure 22 can have one, two or more functional layer structure units formed one above the other and one, two or more intermediate layers between the layer structure units. The organic functional layer structure 22 may be segmented in the lateral direction.

The support 12 may be in translucent or transparent form. The support 12 serves as a support element for electronic elements or layers, for example light emitting elements. The support 12 can have, or be formed from, glass, quartz, and/or a semiconductor material, for example, or any other suitable material. Further, the support 12 can have, or be formed from, a plastic film or a laminate having one or having multiple plastic films. The plastic can have one or more polyolefins. Further, the plastic can have polyvinyl chloride (PVC), polystyrene (PS), polyester and/or polycarbonate (PC), polyethylene terephthalate (PET), polyethersulfone (PES) and/or polyethylene naphthalate (PEN). The support 12 can have or be formed from a metal, for example copper, silver, gold, platinum, iron, for example a metal compound, for example steel. The support 12 can be in the form of a metal foil or metal-coated foil. The support 12 may be part of a mirror structure or can form said mirror structure. The support 12 can have a mechanically rigid region and/or a mechanically flexible region or may be formed in such a manner.

The first electrode layer 20 may be in the form of an anode or in the form of a cathode. The first electrode layer 20 may be in translucent or transparent form. The first electrode layer 20 has an electrically conductive material, for example metal and/or a transparent conductive oxide (TCO) or a layer stack of multiple layers that have metals or TCOs. The first electrode layer 20 can have, by way of example, a layer stack including a combination of a layer of a metal on a layer of a TCO, or vice versa. An example is a silver layer that is applied to an indium tin oxide (ITO) layer (Ag on ITO) or ITO/Ag/ITO multilayers. The first electrode layer 20 may be segmented.

The metal used may be, by way of example, Ag, Pt, Au, Mg, Al, Ba, In, Ca, Sm or Li, and compounds, combinations or alloys of these materials.

Transparent conductive oxides are transparent, conductive materials, for example metal oxides, such as, by way of example, zinc oxide, tin oxide, cadmium oxide, titanium oxide, indium oxide or indium tin oxide (ITO). Besides binary metal oxygen compounds, such as, by way of example ZnO, SnO2, or In2O3, ternary metal oxygen compounds, such as, by way of example, AlZnO, Zn2SnO4, CdSnO3, ZnSnO3, MgIn2O4, GaInO3, Zn2In2O5 or In4Sn3O12 or mixtures of different transparent conductive oxides also belong to the group of TCOs.

The first electrode layer 20 can have, as an alternative or in addition to the cited materials: networks of metal nanowires and nanoparticles, for example made of Ag, networks of carbon nanotubes, graphene particles and layers and/or networks of semiconductive nanowires. By way of example, the first electrode layer 20 can have one of the following structures or be formed therefrom: a network of metal nanowires, for example made of Ag, that are combined with conductive polymers, a network of carbon nanotubes that are combined with conductive polymers, and/or graphene layers and composites. Further, the first electrode layer 20 can have electrically conductive polymers or transition metal oxides.

The first electrode layer 20 can have, by way of example, a layer thickness in a range from 10 nm to 500 nm, for example from 25 nm to 250 nm, for example from 50 nm to 100 nm.

The first electrode layer 20 can have a first electrical connection to which a first electrical potential can be applied. The first electrical potential can be provided by an energy source (not shown), for example by a current source or a voltage source. Alternatively, the first electrical potential can be applied to the support 12 and supplied to the first electrode layer 20 indirectly via the support 12. The first electrical potential may be, by way of example, the ground potential or another prescribed reference-ground potential.

The organic functional layer structure 22 can have a hole injection layer, a hole transport layer, an emitter layer, an electron transport layer and/or an electron injection layer.

The hole injection layer may be formed on or above the first electrode layer 20. The hole injection layer can have one or more of the following materials or be formed therefrom: HAT-CN, Cu(I)pFBz, MoOx, WOx, VOx, ReOx, F4-TCNQ, NDP-2, NDP-9, Bi(III)pFBz, F16CuPc; NPB (N,N'-bis (naphthalene-1-yl)-N,N'-bis(phenyl)benzidine); beta-NPB N,N'-bis(naphthalene-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); Spiro-NPB (N,N'-bis(naphthalene-1-yl)-N, N'-bis(phenyl)spiro); DMFL-TPD N,N'-bis(3-methylphenyl)-N,N'-bis(phenyl)-9,9-dimethyl-fluorene); DMFL-NPB (N,N'-bis(naphthalene-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalene-1-yl)-N,N'-bis(phenyl)-9,9-diphenyl-fluorene); Spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalene-2-yl-amino)phenyl]-9H-fluorene; 9,9-bis[4-(N, N'-bis-naphthalene-2-yl-N,N'-bis-phenyl-amino)phenyl]-9H-fluorine; N,N'-bis(phenanthrene-9-yl)-N,N'-bis(phenyl) benzidine; 2,7 bis[N,N-bis(9,9-spiro-bifluorene-2-yl) amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino) phenyl]cyclohexane; 2,2',7,7'-tetra(N,N-di-tolyl)amino-spiro-bifluorene; and/or N,N,N',N'-tetra-naphthalene-2-yl-benzidine.

The hole injection layer can have a layer thickness in a range from approximately 10 nm to approximately 1000 nm, for example in a range from approximately 30 nm to approximately 300 nm, for example in a range from approximately 50 nm to approximately 200 nm.

Formed on or above the hole injection layer, there may be the hole transport layer. The hole transport layer can have one or more of the following materials or be formed therefrom: NPB (N,N'-bis(naphthalen-1-yl)-N,N'-bis(phenyl) benzidine); beta-NPB N,N'-bis(naphthalene-2-yl)-N,N'-bis (phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); Spiro-NPB (N,N'-bis(naphthalene-1-yl)-N,N'-bis(phenyl)spiro); DMFL-TPD N,N'-bis(3-methylphenyl)-N,N'-bis(phenyl)-9, 9-dimethyl-fluorene); DMFL-NPB (N,N'-bis(naphthalene-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalene-1-yl)-N,N'-bis (phenyl)-9,9-diphenyl-fluorene); Spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalene-2-yl-amino)phenyl]-9H-fluorene; 9,9-bis[4-(N,N'-bis-naphthalene-2-yl-N,N'-bis-phenyl-amino)phenyl]-9H-fluorine; N,N'-bis(phenanthrene-9-yl)-N,N'-bis(phenyl)benzidine; 2,7-bis[N,N-bis(9,9-spiro-bifluorene-2-yl)amino]-9,9-spiro-bifluorene; 2,2'-bis[N,N-bis(biphenyl-4-yl)amino]9,9-spiro-bifluorene; 2,2'-bis(N,N-diphenyl-amino)-9,9-spiro-bifluorene; di-[4-(N,N-ditolyl-amino)-phenyl]cyclohexane; 2,2',7,7'-tetra(N, N-di-tolyl) amino-spiro-bifluorene; and N,N,N',N'-tetra-naphthalene-2-yl-benzidine.

The hole transport layer can have a layer thickness in a range from approximately 5 nm to approximately 50 nm, for example in a range from approximately 10 nm to approximately 30 nm, for example approximately 20 nm.

Formed on or above the hole transport layer, there may be the one or more emitter layers, for example with fluorescent and/or phosphorescent emitters. The emitter layer can have organic polymers, organic oligomers, organic monomers, organic small, nonpolymeric molecules ("small molecules") or a combination of these materials. The emitter layer can have one or more of the following materials or be formed therefrom: organic or organometallic compounds, such as derivatives of polyfluorene, polythiophene and polyphenylene (e.g. 2- or 2,5-substituted poly-p-phenylenevinylene) and metal complexes, for example iridium complexes such as blue phosphorescent FIrPic (bis(3,5-difluoro-2-(2-pyridyl)phenyl-(2-carboxypyridyl)iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)amino]anthracene) and red fluorescent DCM2 (4-dicyanomethylene)-2-methyl-6-julolidyl-9-enyl-4H-pyrane) as nonpolymeric emitters. Nonpolymeric emitters of this kind can be deposited by means of thermal vapor deposition, for example. Further, polymer emitters can be used, which can be deposited by means of a wet chemical method, for example, such as, by way of example, a spin coating method. The emitter materials may be embedded in a matrix material, for example a technical ceramic or a polymer, for example an epoxy, or a silicone, in a suitable manner.

The first emitter layer can have a layer thickness in a range from approximately 5 nm to approximately 50 nm, for example in a range from approximately 10 nm to approximately 30 nm, for example approximately 20 nm.

The emitter layer can have emitter materials emitting in a single color or in different colors (for example blue and yellow or blue, green and red). Alternatively, the emitter layer can have multiple partial layers that emit light of different color. Mixing of the different colors can result in the emission of light with a white impression of color. Alternatively or additionally, there may be provision for the beam path of the primary emission produced by these layers to have a converter material arranged in it that at least partially absorbs the primary radiation and emits a secondary radiation of different wavelength, so that a white impression of color is obtained from a (not yet white) primary radiation through the combination of primary radiation and secondary radiation.

Formed, for example deposited, on or above the emitter layer, there may be the electron transport layer. The electron transport layer can have one or more of the following materials or be formed there from: NET-18; 2,2',2"-(1,3,5-benzinetriyl)-tris(1-phenyl-1-H-benzimidazoles); 2-(4-biphenylyl)-5-(4-tert-butylphenyl)-1,3,4-oxadiazoles,2,9-dimethyl-4,7-diphenyl-1,10-phenanthrolines (BCP); 8-hydroxy-quinolinolato-lithium, 4-(naphthalene-1-yl)-3,5-diphenyl-4H-1,2,4-triazoles; 1,3-bis[2-(2,2'-bipyridine-6-yl)-1,3,4-oxadiazo-5-yl]benzenes; 4,7-diphenyl-1,10-phenanthrolines (BPhen); 3-(4-biphenylyl)-4-phenyl-5-tert-butylphenyl-1,2,4-triazoles; bis(2-methyl-8-quinolinolates)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalene-2-yl)-anthracenes; 2,7-bis[2-(2,2'-bipyridine-6-yl)-1,3,4-oxadiazo-5-yl]-9,9-dimethylfluorenes; 1,3-bis[2-(4-tert-butylphenyl)-1,3,4-oxadiazo-5-yl]benzene; 2-(naphthalene-2-yl)-4,7-diphenyl-1,10-phenanthrolines; 2,9-bis(naphthalene-2-yl)-4,7-diphenyl-1,10-phenanthrolines; tris(2,4,6-trimethyl-3-(pyridin-3-yl)phenyl)boranes; 1-methyl-2-(4-(naphthalene-2-yl)phenyl)-1H-imidazo[4,5-f][1,10]phenanthroline; phenyl-dipyrenylphosphine oxides; naphthalenetetracarboxylic dianhydride or the imides thereof; perylenetetracarboxylic dianhydride or the imides thereof; and substances based on silols with a silacyclopentadiene unit.

The electron transport layer can have a layer thickness in a range from approximately 5 nm to approximately 50 nm, for example in a range from approximately 10 nm to approximately 30 nm, for example approximately 20 nm.

Formed on or above the electron transport layer, there may be the electron injection layer. The electron injection layer can have one or more of the following materials or be formed therefrom: NDN-26, MgAg, Cs2CO3, Cs3PO4, Na, Ca, K, Mg, Cs, Li, LiF; 2,2',2"-(1,3,5-benzinetriyl)-tris(1-phenyl-1-H-benzimidazoles); 2-(4-biphenylyl)-5-(4-tert-butylphenyl)-1,3,4-oxadiazoles,2,9-dimethyl-4,7-diphenyl-1,10-phenanthrolines (BCP); 8-hydroxyquinolinolato-lithium, 4-(naphthalen-1-yl)-3,5-diphenyl-4H-1,2,4-triazoles; 1,3-bis[2-(2,2'-bipyridine-6-yl)-1,3,4-oxadiazo-5-yl]benzenes; 4,7-diphenyl-1,10-phenanthrolines (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalene-2-yl)-anthracenes; 2,7-bis[2-(2,2'-bipyridine-6-yl)-1,3,4-oxadiazo-5-yl]-9,9-dimethylfluorenes; 1,3-bis[2-(4-tert-butylphenyl)-1,3,4-oxadiazo-5-yl]benzenes; 2-(naphthalen-2-yl)-4,7-diphenyl-1,10-phenanthrolines; 2,9-bis(naphthalen-2-yl)-4,7-diphenyl-1,10-phenanthrolines; tris(2,4,6-trimethyl-3-(pyridine-3-yl)phenyl)boranes; 1-methyl-2-(4-(naphthalen-2-yl)phenyl)-1H-imidazo[4,5-f][1,10]phenanthrolines; phenyl-dipyrenylphosphine oxides; naphthalenetetracarboxylic dianhydride or the imides thereof; perylenetetracarboxylic dianhydride or the imides thereof; and substances based on silols with a silacyclopentadiene unit.

The electron injection layer can have a layer thickness in a range from approximately 5 nm to approximately 200 nm, for example in a range from approximately 20 nm to approximately 50 nm, for example approximately 30 nm.

In the case of an organic functional layer structure 22 having two or more organic functional layer structure units, appropriate intermediate layers may be formed between the organic functional layer structure units. The organic functional layer structure units may each individually be formed separately in accordance with an embodiment of the organic functional layer structure 22 explained above. The intermediate layer may be in the form of an intermediate electrode. The intermediate electrode may be electrically connected to an external voltage source. The external voltage source can provide a third electrical potential, for example, at the intermediate electrode. The intermediate electrode can also have no external electrical connection, however, for example by virtue of the intermediate electrode having a floating electrical potential.

The organic functional layer structure unit can have, by way of example, a layer thickness of no more than approximately 3 μm, for example a layer thickness of no more than approximately 1 μm, for example a layer thickness of no more than approximately 300 nm.

The light emitting diode 1 can optionally have further functional layers, for example arranged on or above the one or more emitter layers or on or above the electron transport layer. The further functional layers may, by way of example, be internal or external coupling-in/out structures that can further improve the functionality and hence the efficiency of the light emitting diode 1.

The second electrode layer 23 may be formed in accordance with one of the embodiments of the first electrode layer 20, wherein the first electrode layer 20 and the second electrode layer 23 may be in the same or different form(s). The second electrode layer 23 may be in the form of an anode or in the form of a cathode. The second electrode layer 23 can have a second electrical connection to which a second electrical potential can be applied. Optionally, the second electrode layer 23 may be segmented. The second electrical potential can be provided by the same or a different energy source as/than the first electrical potential. The second electrical potential may be different than the first electrical potential. The second electrical potential can, by way of example, have a value such that the difference in relation to the first electrical potential has a value in a range from approximately 1.5 V to approximately 20 V, for example a value in a range from approximately 2.5 V to approximately 15 V, for example a value in a range from approximately 3 V to approximately 12 V.

The encapsulation layer 24 can also be referred to as a thin-layer encapsulation. The encapsulation layer 24 may be in the form of a translucent or transparent layer. The encapsulation layer 24 forms a barrier vis-à-vis chemical impurities and atmospheric substances, particularly vis-à-vis water (moisture) and oxygen. In other words, the encapsulation layer 24 is in a form such that it cannot be penetrated, or can be penetrated by no more than very small proportions, by substances that can damage the light emitting diode 1, for example water, oxygen or solvents. The encapsulation layer 24 may be in the form of a single layer, a layer stack or a layer structure.

The encapsulation layer 24 can have or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon 66, and mixtures and alloys thereof.

The encapsulation layer 24 can have a layer thickness from approximately 0.1 nm (an atomic layer) to approximately 1000 nm, for example a layer thickness from approximately 10 nm to approximately 100 nm, for example approximately 40 nm. The encapsulation layer 24 can have a highly refractive material, for example one or more material(s) having a high refractive index, for example having a refractive index from 1.5 to 3, for example from 1.7 to 2.5, for example from 1.8 to 2.

If need be, the first barrier layer may be formed on the support 12 in a manner corresponding to an embodiment of the encapsulation layer 24.

The encapsulation layer 24 can be formed, by way of example, by means of a suitable deposition method, e.g. by means of an atomic layer deposition (ALD) method, e.g. a plasma enhanced atomic layer deposition (PEALD) method or a plasma-less atomic layer deposition (PLALD) method, or by means of a chemical vapor deposition (CVD) method, e.g. a plasma enhanced chemical vapor deposition (PECVD) method or a plasma-less chemical vapor deposition (PL-CVD) method, or alternatively by means of other suitable deposition methods.

Optionally, a coupling-in or -out layer may be formed, by way of example, as an external film (not shown) on the support 12 or as an internal coupling-out layer (not shown) in the layer cross section of the light emitting diode 1. The coupling-in/out layer can have a matrix and scattering centers distributed therein, wherein the mean refractive index of the coupling-in/out layer is higher than the mean refractive index of the layer from which the electromagnetic radiation is provided. Further, one or more antireflection layers may additionally be formed.

The adhesive agent layer 36 can have, by way of example, adhesive and/or lacquer by means of which the cover body 38 is arranged, for example adhesively bonded, on the encapsulation layer 24, for example. The adhesive agent layer 36 may be in transparent or translucent form. The adhesive agent layer 36 can have, by way of example, particles that scatter electromagnetic radiation, for example light-scattering particles. As a result, the adhesive agent layer 36 can act as a scattering layer and lead to an improvement in color angle distortion and coupling-out efficiency.

The light-scattering particles provided may be dielectric scattering particles, for example including a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide or titanium oxide. Other particles may also be suitable, provided that they have a refractive index that is different than the effective refractive index of the matrix of the adhesive agent layer 36, for example air bubbles, acrylate or hollow glass spheres. Further, it is possible, by way of example, for metallic nanoparticles, metals such as gold, silver, iron nanoparticles, or the like to be provided as light-scattering particles.

The adhesive agent layer 36 can have a layer thickness of greater than 1 μm, for example a layer thickness of several μm. In various exemplary embodiments, the adhesive may be a lamination adhesive.

The adhesive agent layer 36 can have a refractive index that is lower than the refractive index of the cover body 38. The adhesive agent layer 36 can have, by way of example, a low refractive index adhesive, such as, by way of example, an acrylate, which has a refractive index of approximately 1.3. However, the adhesive agent layer 36 can also have a high refractive index adhesive that has, by way of example, high refractive index, nonscattering particles and that has a refractive index averaged over layer thickness that corresponds approximately to the mean refractive index of the organically functional layer structure 22, for example in a range from approximately 1.6 to 2.5, for example from 1.7 to approximately 2.0.

Arranged on or above the active region, there may be (not shown) what is known as a gettering layer or gettering structure, i.e. a laterally structured gettering layer. The gettering layer may be in translucent, transparent or opaque form. The gettering layer can have a material, or be formed therefrom, that absorbs and binds substances that are harmful to the active region. A gettering layer can, by way of example, have a zeolite derivative or be formed therefrom. The gettering layer can have a layer thickness of greater than 1 µm, for example a layer thickness of several µm. In various exemplary embodiments, the gettering layer can have a lamination adhesive or be embedded in the adhesive agent layer 36.

The cover body 38 may, by way of example, be formed by a glass body, a metal foil or a sealed plastic film cover body. The cover body 38 may be arranged on the encapsulation layer 24 or the active region, for example by means of a frit joint (glass frit bonding/glass soldering/seal glass bonding) by means of a conventional glass solder in the geometric edge regions of the light emitting diode 1. The cover body 38 can have, by way of example, a refractive index (for example for a wavelength of 633 nm) from, by way of example, 1.3 to 3, for example from 1.4 to 2, for example from 1.5 to 1.8.

According to various exemplary embodiments, the method for identifying a short in a first light emitting diode element 50 involves the first light emitting diode element 50 being operated in the off-state region. A check is performed to determine whether an electric current IR flows via the first light emitting diode element 50 in the off-state direction. The short is identified if the check reveals that the current IR flows in the off-state direction and is larger than a prescribed leakage current.

According to various exemplary embodiments, the method involves checking whether the current IR flows via the first light emitting diode element 50 in the off-state direction by virtue of a reverse voltage UR being applied to the first light emitting diode element 50 and the current IR being recorded in the off-state direction.

According to various exemplary embodiments, the method involves a first actuating circuit 42, which is designed to actuate the first light emitting diode element 50, being is in a switched-off condition, wherein an output of the first actuating circuit 42 is electrically coupled to a first electrode 51 of the first light emitting diode element 50. A second actuating circuit 46, which is designed to actuate a second light emitting diode element 52, is in a switched-off condition, wherein an output of the second actuating circuit 46 is electrically coupled to a first electrode 53 of the second light emitting diode element 52 and wherein an input of the first actuating circuit 42, an input of the second actuating circuit 46, a second electrode 57 of the first light emitting diode element 50 and a second electrode 58 of the second light emitting diode element 52 are electrically coupled to a first node 62. The first electrode 51 of the first light emitting diode element 50 is electrically coupled to a first connection of a test energy source 44, 86, wherein a second connection of the test energy source 44, 86 is electrically coupled to the first node 62. The test energy source 44, 86 is used to operate the first light emitting diode element 50 in the off-state region.

According to various exemplary embodiments, the test energy source 44, 86 is a test current source 86 and a check is performed to determine whether the electric current IR flows via the first light emitting diode element 50 in the off-state direction by virtue of a reverse voltage UR being recorded that is present across the test current source 86, or the test energy source 44, 86 is a test voltage source 44 and a check is performed to determine whether the electric current IR flows via the first light emitting diode element 50 in the off-state direction by virtue of the current that flows via the test voltage source 44 being recorded directly.

According to various exemplary embodiments, a first actuating circuit 42 is arranged for actuating the first light emitting diode element 50, and a second actuation circuit 46 is arranged for actuating a second light emitting diode element 52, and the first light emitting diode element 50 is operated in the off-state region by means of the second actuating circuit 46.

According to various exemplary embodiments, the first actuating circuit 42 is in the switched-off condition, wherein an output of the first actuating circuit 42 is electrically coupled to a first electrode 51 of the first light emitting diode element 50, the second actuating circuit 46 is in the switched-off condition, wherein an output of the second actuating circuit 46 is electrically coupled to a first electrode 53 of the second light emitting diode element 52 and wherein an input of the first actuating circuit 42, an input of the second actuating circuit 46, a second electrode 57 of the first light emitting diode element 50 and a second electrode 58 of the second light emitting diode element 52 are electrically coupled to a first node 62. The first electrode 51 of the first light emitting diode element 50 is electrically coupled to the first node 62. The second electrode 57 of the first light emitting diode element 50 and the second electrode 58 of the second light emitting diode element 52 are electrically isolated from the first node 62, wherein the second electrode 57 of the first light emitting diode element 50 and the second electrode 58 of the second light emitting diode element 52 remain electrically coupled to one another, and the second actuating circuit 46 is switched on, as a result of which the first light emitting diode element 50 is operated in the off-state region. A check is performed to determine whether the electric current IR flows via the first light emitting diode element 50 in the off-state direction by virtue of an actuating voltage of the second actuating circuit 46 being recorded and a short being identified if the actuating voltage does not reach or does not exceed a first actuating voltage threshold value, or by virtue of an actuating current IF of the second actuating circuit 46 being recorded and the short being identified if the actuating current IF is larger than a prescribed actuating current threshold value.

According to various exemplary embodiments, an analysis voltage UA between the second electrode 57 of the first light emitting diode element 50 and the first electrode 51 of the first light emitting diode element 50 is recorded, and the recorded analysis voltage UA is taken as a basis for classifying the short.

According to various exemplary embodiments, the first actuating circuit 42 is in the switched-off condition, wherein an output of the first actuating circuit 42 is electrically coupled to a first electrode 51 of the first light emitting diode element 50. The second actuating circuit 46 is in the switched-off condition, wherein an output of the second actuating circuit 46 is electrically coupled to a first electrode 53 of the second light emitting diode element 52 and wherein an input of the first actuating circuit 42, an input of the second actuating circuit 46, a second electrode 57 of the first light emitting diode element 50 and a second electrode 58 of the second light emitting diode element 52 are electrically coupled to a first node 62. The first actuating circuit 42 is switched on such that an actuating voltage of the first actuating circuit 42 is smaller than a prescribed second actuating voltage threshold value, as a result of which a first capacitor 90 is charged that is electrically connected between the first electrode 51 of the first light emitting diode element 50 and the first node 62. The second electrode 57 of the first light emitting diode element 50 and the second electrode 58 of the second light emitting diode element 52 are electrically isolated from the first node 62, wherein the second electrode 57 of the first light emitting diode element 50 and the second electrode 58 of the second light emitting diode element 52 remain electrically coupled to one another. A capacitor voltage UK of the first capacitor 90 is monitored and the second actuating circuit 46 is switched on, as a result of which the first light emitting diode element 50 is operated in the off-state region, and it is identified that the current IR flows in the off-state direction and is larger than a prescribed leakage current if a change occurring in the capacitor voltage UK becomes larger than a prescribed capacitor voltage threshold value.

According to various exemplary embodiments, an optoelectronic subassembly has a first light emitting diode element 50 and an electronic circuit 40 that is designed to operate the first light emitting diode element 50 in the off-state region, to check whether an electric current IR flows via the first light emitting diode element 50 in the off-state direction, and to identify a short in the first light emitting diode element 50 if the check reveals that the current IR flows in the off-state direction and is larger than a prescribed leakage current.

According to various exemplary embodiments, the optoelectronic subassembly has a test voltage source 44, which is designed to apply a reverse voltage UR to the first light emitting diode element 50, and a current measuring apparatus 82, which is designed to record the current IR in the off-state direction.

According to various exemplary embodiments, the optoelectronic subassembly has a second light emitting diode element 52, wherein a second electrode 57 of the first light emitting diode element 50 and a second electrode 58 of the second light emitting diode element 52 are electrically coupled to one another, a first actuating circuit 42, wherein an output of the first actuating circuit 42 is electrically coupled to a first electrode 51 of the first light emitting diode element 50, a second actuating circuit 46, wherein an output of the second actuating circuit 46 is electrically coupled to a first electrode 53 of the second light emitting diode element 52 and wherein an input of the first actuating circuit 42, an input of the second actuating circuit 46, the second electrode 57 of the first light emitting diode element 50 and the second electrode 58 of the second light emitting diode element 52 are electrically coupled to a first node 62, a test energy source 44, 86 having a first connection and having a second connection, wherein the second connection is electrically coupled to a first node 62, and a first test switch T1 that is electrically coupled to the first electrode 51 of the first light emitting diode element 50 and to the first connection of the test energy source 44, 86 and that, in its first switching state, electrically couples the first electrode 51 of the first light emitting diode element 50 to the first connection of the test energy source 44, 86 and that, in its second switching state, electrically isolates the first electrode 51 of the first light emitting diode element 50 and the first connection of the test energy source 44, 86 from one another.

According to various exemplary embodiments, the test energy source 44, 86 is a test current source 86 and the optoelectronic subassembly has a test voltage recording apparatus that is designed to record a reverse voltage UR that is present across the test current source 86, or the test energy source 44, 86 is a test voltage source 44 and the optoelectronic subassembly has a test current recording apparatus 82 that is designed to record the current IR in the off-state direction that flows via the test voltage source 44.

According to various exemplary embodiments, the optoelectronic subassembly has a second light emitting diode element 52, a first actuating circuit 42 for actuating the first light emitting diode element 50 and a second actuating circuit 46 for actuating the second light emitting diode element 52, which are arranged and designed such that the first light emitting diode element 50 is operated in the off-state region by means of the second actuating circuit 46.

According to various exemplary embodiments, a second electrode 57 of the first light emitting diode element 50 and a second electrode 58 of the second light emitting diode element 52 are electrically coupled to one another. An output of the first actuating circuit 42 is electrically coupled to a first electrode 51 of the first light emitting diode element 50, and an output of the second actuating circuit 46 is electrically coupled to a first electrode 53 of the second light emitting diode element 52, wherein an input of the first actuating circuit 42, an input of the second actuating circuit 46, the second electrode 57 of the first light emitting diode element 50 and the second electrode 58 of the second light emitting diode element 52 are electrically coupled to a first node 62. The optoelectronic subassembly has a first test switch T1 that, in its first switching state, electrically couples the first electrode 51 of the first light emitting diode element 50 to the first node 62 and that, in its second switching state, electrically isolates the first electrode 51 or the first light emitting diode element 50 and the first node 62 from one another, an isolating switch T4 that, in its first switching state, electrically couples the second electrode 57 of the first light emitting diode element 50 and the second electrode 58 of the second light emitting diode element 52 to the first node 62 and that, in its second switching state, electrically isolates the second electrode 57 of the first light emitting diode element 50 and the second electrode 58 of the second light emitting diode element 52 from the first node 62.

According to various exemplary embodiments, the optoelectronic subassembly has an analysis voltage apparatus 88 that is designed to record an analysis voltage UA between the second electrode 57 of the first light emitting diode element 50 and the first electrode 51 of the first light emitting diode element 50.

According to various exemplary embodiments, a second electrode 57 of the first light emitting diode element 50 and a second electrode 58 of the second light emitting diode element 52 are electrically coupled to one another. An output of the first actuating circuit 42 is electrically coupled to a first electrode 51 of the first light emitting diode element 50, and an output of the second actuating circuit 46 is electrically coupled to a first electrode 53 of the second light emitting diode element 52, wherein an input of the first actuating circuit 42, an input of the second actuating circuit 46, the second electrode 57 of the first light emitting diode element 50 and the second electrode 58 of the second light emitting diode element 52 are electrically coupled to a first node 62. The optoelectronic subassembly has a first capacitor 90 that is firstly electrically coupled to the output of the first actuating circuit 42 and that is secondly electrically coupled to the input of the first actuating circuit 42, an isolating switch T4 that, in its first switching state, electrically couples the second electrode 57 of the first light emitting diode element 50 and the second electrode 58 of the second light emitting diode element 52 to the first node 62 and that, in its second switching state, electrically isolates the second electrode 57 of the first light emitting diode element 50 and the second electrode 58 of the second light emitting diode element 52 from the first node 62, and a capacitor voltage recording apparatus 98 that is designed to record a capacitor voltage UK that is present across the first capacitor 90.

According to various exemplary embodiments, the optoelectronic subassembly has an organic light emitting diode 1 that has the first light emitting diode element 50 and the second light emitting diode element 52, wherein the second electrode 57 of the first light emitting diode element 50 and the second electrode 58 of the second light emitting diode element 52 are formed by a second electrode layer 23 of the organic light emitting diode 1.

The present disclosure is not limited to the exemplary embodiments indicated. By way of example, the light emitting diode 1 can have more or fewer light emitting diode elements 50, 52, 54. Alternatively or additionally, the optoelectronic subassembly can have more or fewer light emitting diodes 1, light emitting diode elements 50, 52, 54 and/or corresponding actuating circuits 42, 46, 48. Furthermore, all exemplary embodiments shown may be formed with or without protective diodes 64, 66, 68. Further, instead of the light emitting diode 1 with the light emitting diode elements 50, 52, 54, all exemplary embodiments can have the light emitting diode elements 50, 52, 54 replaced by mutually independent light emitting diodes 1.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A method for identifying a short in a first light emitting diode element, wherein a first actuating circuit is arranged for actuating the first light emitting diode element and a second actuating circuit is arranged for actuating a second light emitting diode element, the method comprising:
   operating the first light emitting diode element in the off-state region by means of the second actuating circuit,
   performing a check to determine whether an electric current flows via the first light emitting diode element in the off-state direction, and
   identifying the short if the check reveals that the current flows in the off-state direction and is larger than a prescribed leakage current.

2. The method as claimed in claim 1,
   wherein the first actuating circuit is in a switched-off condition, and wherein an output of the first actuating circuit is electrically coupled to a first electrode of the first light emitting diode element,
   wherein the second actuating circuit is in a switched-off condition, wherein an output of the second actuating circuit is electrically coupled to a first electrode of the second light emitting diode element and wherein an input of the first actuating circuit, an input of the second actuating circuit, a second electrode of the first light emitting diode element and a second electrode of the second light emitting diode element are electrically coupled to a first node,
   wherein the first electrode of the first light emitting diode element is electrically coupled to the first node,
   wherein the second electrode of the first light emitting diode element and the second electrode of the second light emitting diode element are electrically isolated from the first node, wherein the second electrode of the first light emitting diode element and the second electrode of the second light emitting diode element remain electrically coupled to one another, and the second actuating circuit is switched on, as a result of which the first light emitting diode element is operated in the off-state region, and
   wherein a check is performed to determine whether the electric current flows via the first light emitting diode element in the off-state direction by virtue of an actuating voltage of the second actuating circuit being recorded and the short being identified if the actuating voltage does not reach or does not exceed a first actuating voltage threshold value, or by virtue of an actuating current of the second actuating circuit being recorded and the short being identified if the actuating current is larger than a prescribed actuating current threshold value.

3. The method as claimed in claim 2, wherein an analysis voltage between the second electrode of the first light emitting diode element and the first electrode of the first light emitting diode element is recorded and in which the recorded analysis voltage is taken as a basis for classifying the short.

4. The method as claimed in claim 1,
   wherein the first actuating circuit is in a switched-off condition, and wherein an output of the first actuating circuit is electrically coupled to a first electrode of the first light emitting diode element,
   wherein the second actuating circuit is in a switched-off condition, wherein an output of the second actuating circuit is electrically coupled to a first electrode of the second light emitting diode element and wherein an input of the first actuating circuit, an input of the second actuating circuit, a second electrode of the first light emitting diode element and a second electrode of the second light emitting diode element are electrically coupled to a first node,
   wherein the first actuating circuit is switched on such that an actuating voltage of the first actuating circuit is smaller than a prescribed second actuating voltage threshold value, as a result of which a first capacitor is charged that is electrically connected between the first electrode of the first light emitting diode element and the first node,
   wherein the second electrode of the first light emitting diode element and the second electrode of the second light emitting diode element are electrically isolated from the first node, wherein the second electrode of the first light emitting diode element and the second electrode of the second light emitting diode element remain electrically coupled to one another, a capacitor voltage of the first capacitor is monitored, and the second actuating circuit is switched on, as a result of which the first light emitting diode element is operated in the off-state region, and
   wherein it is identified that the current flows in the off-state direction and is larger than a prescribed leakage current if a change occurring in the capacitor voltage becomes larger than a prescribed capacitor voltage threshold value.

5. An optoelectronic subassembly, comprising
   a first light emitting diode element,
   a second light emitting diode element and
   an electronic circuit having a first actuating circuit for actuating the first light emitting diode element and a second actuating circuit for actuating the second light emitting diode element, which are arranged and configured such that the first light emitting diode element is operated in the off-state region by means of the second actuating circuit, wherein the electronic circuit is designed to check whether an electric current flows via the first light emitting diode element in the off-state direction, and to identify a short in the first light emitting diode element if the check reveals that the current flows in the off-state direction and is larger than a prescribed leakage current.

6. The optoelectronic subassembly as claimed in claim 5, wherein a second electrode of the first light emitting diode element and a second electrode of the second light emitting diode element are electrically coupled to one another, wherein an output of the first actuating circuit is electrically coupled to a first electrode of the first light emitting diode element and wherein an output of the second actuating circuit is electrically coupled to a first electrode of the second light emitting diode element, wherein an input of the first actuating circuit, an input of the second actuating circuit, the second electrode of the first light emitting diode element and the second electrode of the second light emitting diode element are electrically coupled to a first node, and further comprising, a first test switch that, in its first switching state, electrically couples the first electrode of the first light emitting diode element to the first node and that, in its second switching state, electrically isolates the first electrode of the first light emitting diode element and the first node from one another, and an isolating switch that, in its first switching state, electrically couples the second electrode of the first light emitting diode element and the second electrode of the second light emitting diode element to the first node and that, in its second switching state, electrically isolates the second electrode of the first light emitting diode element and the second electrode of the second light emitting diode element from the first node.

7. The optoelectronic subassembly as claimed in claim 6, further comprising an analysis voltage apparatus that is configured to record an analysis voltage between the second electrode of the first light emitting diode element and the first electrode of the first light emitting diode element.

8. The optoelectronic subassembly as claimed in claim 5, wherein a second electrode of the first light emitting diode element and a second electrode of the second light emitting diode element are electrically coupled to one another, wherein an output of the first actuating circuit is electrically coupled to a first electrode of the first light emitting diode element and wherein an output of the second actuating circuit is electrically coupled to a first electrode of the second light emitting diode element, wherein an input of the first actuating circuit, an input of the second actuating circuit, the second electrode of the first light emitting diode element and the second electrode of the second light emitting diode element are electrically coupled to a first node, and further comprising, a first capacitor that firstly is electrically coupled to the output of the first actuating circuit and that secondly is electrically coupled to the input of the first actuating circuit, an isolating switch that, in its first switching state, electrically couples the second electrode of the first light emitting diode element and the second electrode of the second light emitting diode element to the first node and that, in its second switching state, electrically isolates the second electrode of the first light emitting diode element and the second electrode of the second light emitting diode element from the first node, and a capacitor voltage recording apparatus that is configured to record a capacitor voltage that is present across the first capacitor.

9. The optoelectronic subassembly as claimed in claim 5, which has an organic light emitting diode that has the first light emitting diode element and the second light emitting diode element, wherein the second electrode of the first light emitting diode element and the second electrode of the second light emitting diode element are formed by a second electrode layer of the organic light emitting diode.

* * * * *